United States Patent
Goel et al.

(10) Patent No.: US 9,685,381 B2
(45) Date of Patent: Jun. 20, 2017

(54) INTEGRATING VLSI-COMPATIBLE FIN STRUCTURES WITH SELECTIVE EPITAXIAL GROWTH AND FABRICATING DEVICES THEREON

(71) Applicant: Intel Corporation, Santa Clara, CA (US)

(72) Inventors: Niti Goel, Portland, OR (US); Ravi Pillarisetty, Portland, OR (US); Willy Rachmady, Beaverton, OR (US); Jack T. Kavalieros, Portland, OR (US); Gilbert Dewey, Hillsboro, OR (US); Benjamin Chu-Kung, Portland, OR (US); Marko Radosavljevic, Beaverton, OR (US); Matthew V. Metz, Portland, OR (US); Niloy Mukherjee, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 43 days.

(21) Appl. No.: 14/777,736

(22) PCT Filed: Jun. 28, 2013

(86) PCT No.: PCT/US2013/048773
§ 371 (c)(1),
(2) Date: Sep. 16, 2015

(87) PCT Pub. No.: WO2014/209396
PCT Pub. Date: Dec. 31, 2014

(65) Prior Publication Data
US 2016/0204037 A1    Jul. 14, 2016

(51) Int. Cl.
*H01L 21/8238*    (2006.01)
*H01L 29/267*    (2006.01)
(Continued)

(52) U.S. Cl.
CPC ............. *H01L 21/823807* (2013.01); *H01L 21/02532* (2013.01); *H01L 21/02538* (2013.01);
(Continued)

(58) Field of Classification Search
CPC ......... H01L 21/76248; H01L 21/76262; H01L 21/76272; H01L 21/76278; H01L 21/76297
See application file for complete search history.

(56) References Cited

U.S. PATENT DOCUMENTS

| 2008/0128800 A1 | 6/2008 | Song et al. |
| 2010/0163842 A1 | 7/2010 | Lai et al. |

(Continued)

FOREIGN PATENT DOCUMENTS

| JP | 2011035391 | 2/2011 |
| KR | 1020050066963 | 6/2005 |

(Continued)

OTHER PUBLICATIONS

Intel Corporation, International Preliminary Report on Patentability mailed Jan. 7, 2016, PCT/US2013/048773, filed Jun. 28, 2013.

(Continued)

*Primary Examiner* — Kimberly Rizkallah
*Assistant Examiner* — Bo Bin Jang
(74) *Attorney, Agent, or Firm* — Blakely, Sokoloff, Taylor & Zafman LLP

(57) ABSTRACT

Different n- and p-types of device fins are formed by epitaxially growing first epitaxial regions of a first type material from a substrate surface at a bottom of first trenches formed between shallow trench isolation (STI) regions. The STI regions and first trench heights are at least 1.5 times their width. The STI regions are etched away to expose the top surface of the substrate to form second trenches between (Continued)

the first epitaxial regions. A layer of a spacer material is formed in the second trenches on sidewalls of the first epitaxial regions. Second epitaxial regions of a second type material are grown from the substrate surface at a bottom of the second trenches between the first epitaxial regions. Pairs of n- and p-type fins can be formed from the first and second epitaxial regions. The fins are co-integrated and have reduced defects from material interface lattice mismatch.

21 Claims, 7 Drawing Sheets

(51) Int. Cl.
*H01L 21/02* (2006.01)
*H01L 21/762* (2006.01)
*H01L 21/8234* (2006.01)
*H01L 29/66* (2006.01)
*H01L 29/10* (2006.01)

(52) U.S. Cl.
CPC .. *H01L 21/02647* (2013.01); *H01L 21/76224* (2013.01); *H01L 21/823431* (2013.01); *H01L 21/823821* (2013.01); *H01L 21/823878* (2013.01); *H01L 29/1054* (2013.01); *H01L 29/267* (2013.01); *H01L 29/66795* (2013.01)

(56) References Cited

U.S. PATENT DOCUMENTS

2011/0024794 A1   2/2011   Ko et al.
2011/0318903 A1   12/2011  Fishburn et al.

FOREIGN PATENT DOCUMENTS

TW    201025460      7/2010
TW    201201281      1/2012
WO    WO-2011024794  2/2011

OTHER PUBLICATIONS

Intel Corporation, International search report and written opinion mailed Mar. 27, 2014 for PCT/US20113/048773.

INTEGRATING VLSI-COMPATIBLE FIN STRUCTURES WITH SELECTIVE EPITAXIAL GROWTH AND FABRICATING DEVICES THEREON

CROSS-REFERENCE TO RELATED APPLICATION

This patent application is a U.S. National Phase Application under 35 U.S.C. §371 of International Application No. PCT/US2013/048773, filed Jun. 28, 2013, entitled INTEGRATING VLSI-COMPATIBLE FIN STRUCTURES WITH SELECTIVE EPITAXIAL GROWTH AND FABRICATING DEVICES THEREOF.

BACKGROUND

Field

Circuit devices and the manufacture and structure of fin based circuit devices.

Description of Related Art

Increased performance in circuit devices on a substrate (e.g., integrated circuit (IC) transistors, resistors, capacitors, etc. on a semiconductor (e.g., silicon) substrate) is typically a major factor considered during design, manufacture, and operation of those devices. For example, during design and manufacture or forming of metal oxide semiconductor (MOS) transistor devices, such as those used in a complementary metal oxide semiconductor (CMOS), it is often desired to increase movement of electrons in N-type MOS device (n-MOS) channels and to increase movement of positive charged holes in P-type MOS device (p-MOS) channels. However, performance and movement are slowed by lattice mismatches and defects generated in a between layers of materials used to form the MOS.

For some CMOS implementation, the co-integration of lattice mismatched materials like III-V material epitaxial growth on Silicon is a big challenge. Currently there is no state of art solution to co-integrate n- and p-MOS material epitaxial growths on to a single Silicon substrate. Thus, in current applications, due to large lattice mismatch in materials, defects are generated when novel materials (III-V, Germanium (Ge)) are grown on a Silicon material substrate. These applications also fail to provide an efficient and reliable process for forming both p- and n-type epitaxial electronic device fins from the same substrate.

DETAILED DESCRIPTION

Large lattice mismatch in materials may generate defects when certain materials (e.g., type III-V, or Germanium (Ge) materials) are epitaxially grown on a Silicon material substrate (e.g., single crystal silicon). In some cases, the materials may be epitaxially grown from a substrate surface, in trenches between shallow trench isolation (STI) regions. The growth may be patterned and etched to form "fins" of material in or on which devices may be formed. Thus, the defects may exist in "fins" of material in or on which devices may be formed, after the fins are patterned and etched from the growths. If these defects propagate throughout the trench, they can lead to yield and variations issues in a device built on a device layer formed from epitaxial growth extending above the trench. This propagation may exist in "fin" devices formed in fins that are patterned and etched from epitaxial growth extending above the trench. Such fin devices may include fin integrated circuit (IC) transistors, resistors, capacitors, etc. formed in or on sidewalls of "fins" grown from or extending above a semiconductor (e.g., silicon) substrate or other material. Such devices may include fin metal oxide semiconductor (MOS) transistor devices, such as those used in a complementary metal oxide semiconductor (CMOS) based on movement of electrons in N-type MOS device (n-MOS) channels and movement of positive charged holes in P-type MOS device (p-MOS) channels.

Figure 2:
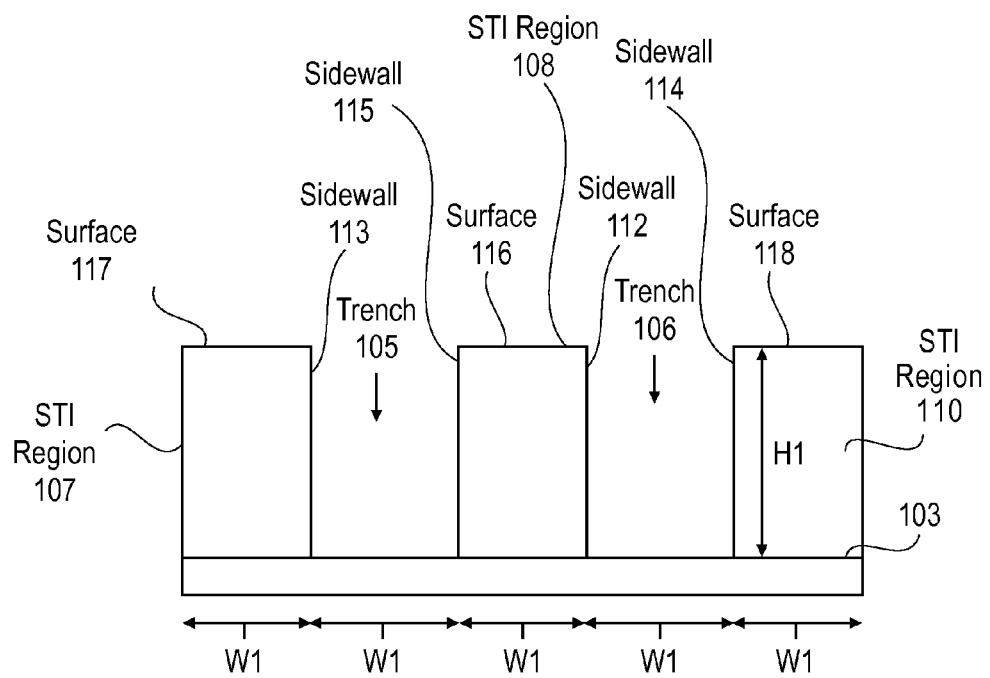
FIG. 2 shows the semiconductor substrate of FIG. 1 after forming STI regions and trenches between the STI regions.

Embodiments describe herein provide a solution to processes that trap defects only in one direction of the fin (along width W, such as shown in FIG. 2). The solution may include a process that uses the concept of aspect ratio trapping where Height (H) of the fin is larger than the width (W). However this scheme leaves large number of defects propagating towards the device layers in the long direction of the fin. According to embodiments, such defects can be avoided by traping defects along the sidewall of the STI forming the trenches (e.g., in both the W an length L directions) by making the Height (H) of the trench larger than the width (W) and length (L) of the trench such that ratios H/W>=1.5 and H/L>=1.5. This ratio may give a minimum H/W ratio limit to block many defects within a buffer layer formed within the trench. Thus, the processes described herein may avoid crystaline defects in the fins due to lattice mismatch in the layer interfaces. For example, defects (e.g., crystaline defects) in the trench may not have extended into or not exist in the epitaxy regions (e.g., the upper device material of the regions). Thus, the fins formed from that material may provide electronic device material (e.g., wells and channels) in which defect free fin based devices may be formed.

In addition, embodiments describe herein provide a more efficient and reliable process for forming both p- and n-type epitaxial electronic device fins from the same substrate by integrating very large scale integration (VLSI) compatible fin structures with selective epitaxial growth and fabricating devices thereon. Such integration may include forming a pair of electronic device fins of different type material in a first, second and third epitaxial region by simultaneously epitaxially growing a first and second epitaxial region of a first epitaxial material on a substrate surface at a bottom of a first and second trench formed between first, second and third shallow trench isolation (STI) regions. The trench heights may be at least 1.5 times their width. Then, the second STI region may be patterned and etched to expose the top surface of the substrate to form a third trench between the first and second epitaxial regions. Then, a layer of a spacer material may be formed on first and second epitaxial region sidewalls. Then, a third epitaxial region of a second epitaxial material (e.g., a different P- or N-type material than the first material) may be epitaxially grown on the substrate surface at a bottom of a third trench formed between the first and second epitaxial regions. The first, second and third epitaxial regions may then be patterned and etched to form a first, second and third pair of electronic device fins from the first, second and third epitaxial regions. Transistor devices can them be formed on at least one device sidewall of each fin (optional).

Thus, the embodiments describe herein provide for (1) co-integration of n- and p-mos (e.g., forming of epitaxial trench material or regions for both n- and p-mos, prior to etching electronic device fins from those material/regions) on to the same silicon surface for CMOS implementation (e.g., and within certain length L, width W, and height H requirements as noted herein); (2) large reduction of defects propagating to the device layers on both n- and p-side electronic device fins; (3) capture defects both along (e.g., length L) and perpendicular (e.g., width W) to the electronic device fin (vertical or height) direction, thus minimizing density of defects reaching active device layers or device fins (e.g., provides bi-directional aspect ratio (e.g., selective epitaxy) trapping of crystaline defects, such as by trapping the 55 degree (110) oriented defects both along the width and length of the fin); and (4) eliminate the need to grow epitaxial layers or regions in thin (W<10 nanometers (nm)) and deep (H>200 nm) trench (e.g., not need to grow epitaxial material or regions in trenches or with Width less than 10 nm). This allows for thicker and shorter trenches and epitaxial layers, thus providing better crystal material and higher yield in the trench epitaxial material used to form fins from, while using less material and processing needed for the larger height trench. In some cases, the bottom of the well (e.g., surface 103) can be patterned to implement various epitaxial growth related defect improvement technologies and ideas. In some cases, the hetero-integrated solution proposed can be utilized to make any device architecture such as trigate, nanowires, nanoribbons, and the like.

Figure 1:
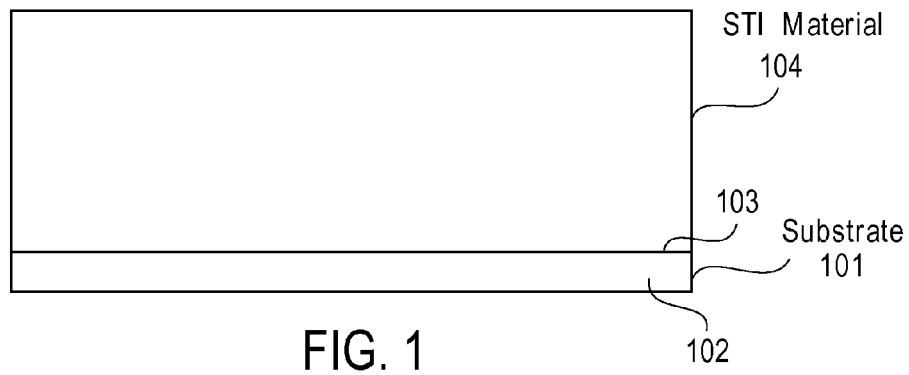
FIG. 1 is a schematic cross section view of a portion of a semiconductor substrate base after forming a layer of shallow trench isolation (STI) material on a top surface of the substrate.

FIG. 1 is a schematic cross section view of a portion of a semiconductor substrate base after forming a layer of STI material on a top surface of the substrate. FIG. 1 shows semiconductor substrate or base 101 of material 102 having top surface 103. Substrate 101 may include, be formed from, deposited with, or grown from silicon, polycrystalline silicon, single crystal silicon, or various other suitable technologies for forming a silicon base or substrate, such as a silicon wafer. For example, according to embodiments, substrate 101 may be formed by growing a single crystal silicon substrate base material having a thickness of between 100 Angstroms and 1000 Angstroms of pure silicon. Alternately, substrate 101 may be formed by sufficient chemical vapor deposition (CVD) of various appropriate silicon or silicon alloy materials 102 to form a layer of material having a thickness between one and three micrometers in thickness, such as by CVD to form a thickness of two micrometers in thickness. It is also considered that substrate 101 may be a relaxed, non-relaxed, graded, and/or non-graded silicon alloy material 102. Material 102 may be a relaxed material (e.g., have a non-strained lattice) at surface 103. Material 102 may be a single crystal silicon material. Substrate 102 may be made of silicon and have top surface 103 with a (100) crystal oriented material (e.g., according to Miller Index). Substrate 101 may be a "miscut" substrate.

FIG. 1 also shows a layer of shallow trench isolation (STI) material 104 formed or grown on top surface 103 of the substrate 101. STI material 104 may be formed of an oxide or a nitride or combination thereof. STI material 104 may be formed of SiC or another material as know in the art. STI material 104 may be formed by atomic layer deposition (ALD) or chemical vapor deposition (CVD). STI material 104 is generally deposited via Plasma Enhanced Chemical Deposition (PECVD). In some cases, any of various oxygen precursors, Silane precursors, or generic precursors can be used during a process (e.g., PECVD) to form STI material 104, as know in the art. In some cases, STI material 104 may be formed by a process using TEOS+O2+RF at 400° C.

The bottom surface of material 104 may have the same (100) crystal orientation as that of material 102 (e.g., at surface 103). In some cases, the bottom surface of material 104 may have the same crystal lattice size as that of material 102 (e.g., at surface 103). Material 104 may be a relaxed material (e.g., have a non-strained lattice) with respect to its interface (e.g., where it is chemically or atomically bonded to the surface below) with surface 103.

FIG. 2 shows the semiconductor substrate of FIG. 1 after forming STI regions and trenches between the STI regions. FIG. 2 shows trenches 105 and 106 defined between STI regions 107, 108 and 110 and surface 103. Regions 107, 108 and 110 may be formed by patterning and etching as known in the art. This may include forming a blanket layer of STI material 104, then patterning and etching material 104 to form STI regions 107, 108 and 110. In some cases, patterning and etching material 104 to form the STI regions includes using a resist or hard mask underneath a resist for the patterning materials. In some cases 1, 2, or 3 resist layers may be used for the patterning materials. In some cases, patterning and etching material 104 to form the STI regions includes using an O2 or O2/Ar plasma etch at pressures in the 10-100 mTorr range, and at room temperature. Such patterning and etching may also include etching an oxides including STI material, by etching with fluorocarbons (e.g., CF4 and/or C4F8), O2 and Ar, at pressures in the 10-100 mTorr range, and at room temperature.

STI region 107 has sidewall 113 and top surface 117. STI region 108 has sidewalls 112 and 115, and has top surface 116. STI region 110 has sidewall 114 and top surface 118. Sidewalls 112, 113, 114 and 115 may be vertical planar surfaces perpenticular to (e.g., at a right angle with respect to) horizontal planar surfaces surface 103 and horizontal planar surfaces 116, 117 and 118. The sidewalls may comprise or be STI material 104. STI regions 107, 108 and 110 may have a width W1 defined by the horizontal distance between their sidewalls. STI region 108 may have width W1 defined by the horizontal distance between sidewall 115 of region 107 and side at sidewall 112 of region 108. STI regions 107, 108 and 110 may have height H1 defined by the vertical distance between top surface 103 and top surface 116, 117 and 118, respectively. STI regions 107, 108 and 110 may have a length L1 defined as the length going into the page and along sidewall 112, 113, 114 or 115.

Trenches 105 and 106 may be defined by the sidewalls of regions 107, 108 and 110. More specifically FIG. 2 shows trench 106 defined by or having a side at sidewall 112 of region 108, a side at sidewall 114 of region 110, a bottom at top surface 103, and a top (e.g., opening or corners) adjacent to top surfaces 116 or 118. FIG. 2 also shows trench 105 defined by or having a side at sidewall 113 of region 107, a side at sidewall 115 of region 108, a bottom at top surface 103, and a top adjacent to top surfaces 117 or 116. Trenches 105 and 106 may include surface 103 of material 102 exposed at the bottom of the trench, such as a planar or planarized surface of crystal material. In some cases, each of trenches 105 and 106 is defined by additional sidewalls of other STI regions, such as a front and back STI having sidewall similar to sidewalls 112, 113, 114 and 115, and top surfaces similar to surfaces 116, 117 or 118, but defining length L of trenches 105 and 106.

Trench 105 may have width W1 defined by the horizontal distance between sidewall 113 of region 107 and side at sidewall 115 of region 108. Trench 106 may have width W1 defined by the horizontal distance between sidewall 112 of region 108 and side at sidewall 114 of region 110. In some cases, width W1 may be a width of between 10 and 100 nanometers (nm). In some cases W1 is approximately 25 nm. In some cases, width W1 is a width of between 30 and 150 nanometers (nm). In some cases W1 is three times the pitch of the fins formed in the epitaxial regions, such as three times the horizontal pitch between the midpoint of fins 380 and 390, or between that of fins 480 and 490 (e.g., see FIGS. 8-9).

Trenches 105 and 106 may have height H1 defined by the vertical distance between top surface 103 and top surface 116, 117 or 118. Height H1 may be a height of between 30 and 300 nanometers (nm). In some cases H1 is approximately 75 nm. H1 of the trench may be larger than the W1 of the trench such that ratio H1/W1 is >=1.5. In some cases, the ratio H1/W1 is =1.5. In some cases, the ratio H1/W1 is >=2.0.

Trenches 105 and 106 may have a length L1 defined as the length going into the page and along sidewall 112, 113, 114 or 115. Length L1 may be a length of between 10 and 100 nanometers (nm). In some cases L1 is approximately 25 nm. In some cases L1 is equal to (or approximately the same as) W1. In some cases L1 is greater than or less than W1.

In some cases, L1 is a width of between 50 and 250 nanometers (nm). In some cases L1 is two times the pitch of the gates of transistor devices formed in the sidewalls of the device portions, such as two times the pitch between the gates of transistor devices formed in the sidewalls of the device portions 580 and 581, or 582 and 583 (e.g., see FIG. 9).

H1 of the trench may be larger than the L1 of the trench such that ratio H1/L1 is >=1.5. In some cases, the ratio H1/L1 is =1.5. In some cases, the ratio H1/L1 is >=2.0. According to some embodiments, W1 may be between 10 and 15 nanometers (nm) and H1 may be 350 nanometers (nm). Optionally L1 may be equal to W1.

FIG. 2 shows trenches 105 and 106 defined between STI regions 107, 108 and 110 and surface 103. However it is contemplated that more, similar trenches and STI regions may exist on substrate 101 (e.g., such as at least hundreds or hundreds of thousands).

Figure 3:
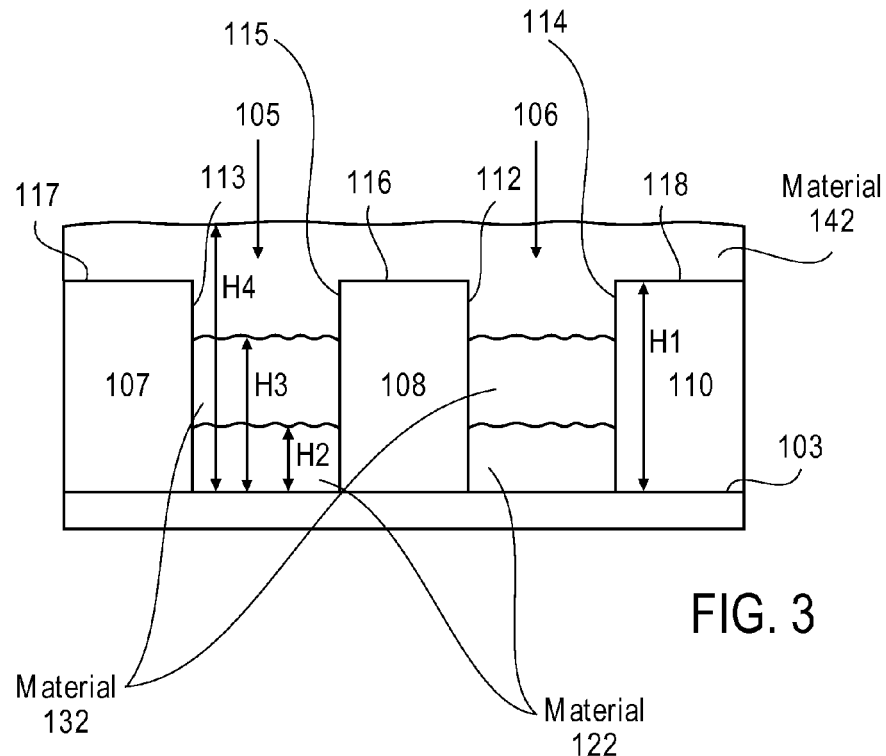
FIG. 3 shows the semiconductor substrate of FIG. 1 after forming epitaxial material in the trenches between the STI regions.

FIG. 3 shows the semiconductor substrate of FIG. 1 after forming epitaxial material in the trenches between the STI regions. FIG. 3 shows forming epitaxial material in trenches 105 and 106, however it is contemplated that trenches 105 and 106 represent any number of trenches formed in STI regions on substrate 101. FIG. 3 shows a first layer of material 122 epitaxially grown from surface 103 in trenches 105 and 106. Material 122 may be epitaxially grown from the crystal surface of substrate surface 103. Material 122 may be formed by epitaxial growth (e.g., heteroepitaxy) using atomic layer deposition (ALD), chemical vapor deposition (CVD), Metal-Organic Chemical Vapour Deposition (MOCVD) or Metalorganic vapour phase epitaxy (MOVPE), and may only grow from "seed" surface 103 below the trench, but not grow from the STI sidewalls or STI top surfaces. Choice of growth deposition like growth temperature, pressure of gas flux, etc may define the selectivity of the epitaxial growth. In some cases, the growth of material 122 is grown selectively from surface 103 by choosing or using a predetermined growth temperature range, pressure of gas flux range, etc., as known for material 122 to grow from material of surface 103, but not grow from or initiate on material of the STI sidewall or top surfaces.

Material 122 may be a first layer of crystalline material that has height H2 from surface 103 which is less than H1. Material 122 may have a bottom surface having a (100) crystal oriented material grown from surface 103, and side surfaces having a (110) crystal oriented material along or adjacent to sidewalls 112, 113, 114 and 115. In some embodiments, crystaline defects may exist in material 122 near or along the sidewalls of the STI forming the trenches.

Material 122 may have a top surface having a (100) crystal orientation (Miller Index). The top surface of material 122 may be polished or etched to form a flat surface having a (100) crystal index. Material 122 may have width W1 between sidewalls 113 and 115 in trench 105; and between sidewalls 112 and 114 in trench 106. Material 122 may have a length L1.

Material 122 may have height H2 defined by the vertical distance between top surface 103 and a top surface of material 122. Height H2 may be a height of between 50-100 nanometers (nm). In some cases H2 is approximately 50 or 70 nm. In some cases, material 122 is a layer of InP or GaAs material.

The bottom surface of material 122 may have the same (100) crystal orientation as that of material 102 (e.g., at surface 103). In some cases, the bottom surface of material 122 may have the same crystal lattice size as that of material 102 (e.g., at surface 103). Material 122 may be a relaxed material (e.g., have a non-strained lattice) with respect to its interface with surface 103. In some cases, material 122 is a relaxed layer (partially or fully) with respect to the substrate (e.g., surface 103).

FIG. 3 shows a second layer of material 132 epitaxially grown from a top surface of material 122. Material 132 may be epitaxially grown from the crystal top surface of material 122. Material 132 may be formed by epitaxial growth (e.g., heteroepitaxy) using chemical vapor deposition (CVD), Metal-Organic Chemical Vapour Deposition (MOCVD), or Metalorganic vapour phase epitaxy (MOVPE), and may only grow from "seed" top surface of material 122 below the trench top, but not grow from the sidewalls or STI top surfaces. In some cases, the growth of material 132 is grown selectively from the top surface of material 122 (e.g., from material 122) by choosing or using a predetermined growth temperature range, pressure of gas flux range, etc., as known for material 132 to grow from material 122, but not grow from or initiate on material of the STI sidewall or top surfaces.

Material 132 may be a second layer of crystalline material that has height H3 defined by the vertical distance between top surface 103 and a top surface of material 132. Height H3 may be less than H1. Material 132 may have a bottom surface having a (100) crystal oriented material grown from material 122, and side surfaces having a (110) crystal oriented material along or adjacent to sidewalls 112, 113, 114 and 115. In some embodiments, crystaline defects may exist in material 132 near or along the sidewalls of the STI forming the trenches. Material 132 may have a top surface having a (100) crystal orientation (Miller Index). The top surface of material 132 may be polished or etched to form a flat surface having a (100) crystal index.

Material 132 may have width W1 between sidewalls 113 and 115 in trench 105; and between sidewalls 112 and 114 in trench 106. Material 132 may have a length L1.

Height H3 may be a height of between 50-400 nanometers (nm). In some cases H3 is approximately 200 or 300 nm. According to some embodiments, the difference in height between the top of material 122 and the top of material 132 may be 200 nanometers (nm). In some cases, material 142 is a layer of InAlAs, GaAsSb, or InP material.

The bottom surface of material 132 may have the same (100) crystal orientation as that of material 122 (e.g., at its top surface). In some cases, the bottom surface of material 132 may have the same crystal lattice size as that of material 122 (e.g., at its top surface). Material 132 may be a relaxed material (e.g., have a non-strained lattice) with respect to its interface with material 122 (e.g., at its top surface). In some cases, material 132 is a relaxed layer (mostly or fully) with respect to material 122 (e.g., a top surface of material 122).

FIG. 3 shows a third layer of material 142 epitaxially grown from a top surface of material 132. Material 142 may be a "device" layer, such as a layer on or in which circuitry devices are formed, as known in the art. Such devices may include devices described herein. Material 142 may be epitaxially grown from the crystal top surface of material 132.

Material 142 may be formed by epitaxial growth (e.g., heteroepitaxy) using chemical vapor deposition (CVD), Metal-Organic Chemical Vapour Deposition (MOCVD) or Metalorganic vapour phase epitaxy (MOVPE), and may only grow from "seed" top surface of material 132 below the trench top, but not grow from the sidewalls or STI top surfaces. In some cases, the growth of material 142 is grown selectively from the top surface of material 132 by choosing or using a predetermined growth temperature range, pressure of gas flux range, etc., as known for material 142 to grow from material 132, but not grow from or initiate on material of the STI sidewall or top surfaces.

Material 142 may be a third layer of crystalline material that has a height H4 defined by the vertical distance between top surface 103 and a top surface of material 142. In some cases, height H4 may be greater than H1. In some cases, material 142 has height H4 extending above or over top surfaces 116, 117 and 118.

Material 142 may have a bottom surface having a (100) crystal oriented material grown from material 132, and side surfaces having a (110) crystal oriented material along a direction parallel to sidewalls 112, 113, 114 and 115. In some embodiments, crystaline defects may that existed in material 122 or 132 near or along the sidewalls of the STI do not extend into material 142 (e.g., do not extend into height H4 above height H3).

Material 142 may have a top surface having a (100) crystal orientation (Miller Index). Material 142 may have horizontal width extending across or over the trenches and top surfaces 116, 117 and 118 of STI regions 107, 108 and 110. Material 142 may have a length L1. In some cases, material 142 is a single layer of InGaAs or InAs material. In some cases, material 142 is a multi-stack of InGaAs/InP/InGaAs material. In some cases, when material 142 is a multi-stack, height H4 may be a height of between 50 and 300 nanometers (nm). In some cases, when material 142 is a single layer, height H4 may be a height of between 20 and 300 nanometers (nm). In some cases, H4 is approximately 50 nm. According to some embodiments, the difference in height between the top of material 132 and the top of material 142 may be 50, 100, or 200 nanometers (nm).

In some cases, material 122 is a bottom layer of InP or GaAs material, material 132 is a middle layer of InAlAs material, and material 142 is a top layer of InGaAs material or is a stack of 5-50 nm InGaAs/2 nm InP/20 nm highly doped InGaAs material (with Indium composition from 53% to 100% in InGaAs).

The bottom surface of material 142 may have the same (100) crystal orientation as that of material 132 (e.g., at its top surface). In some cases, the bottom surface of material 142 may have the same crystal lattice size as that of material 132 (e.g., at its top surface). Material 142 may be a relaxed material (e.g., have a non-strained lattice) with respect to its interface with material 132 (e.g., at its top surface). In some cases, material 142 has a same lattice constant as the bottom of the material 122 or that of surface 103. In some cases, material 142 is lattice matched with respect to material 132 (e.g., a top surface of material 132). In some cases, material 142 is fully strained with respect to material 132 (e.g., a top surface of material 132). The strain may be tensile or compressive strain appropriate to increase carrier mobility.

Figure 4:
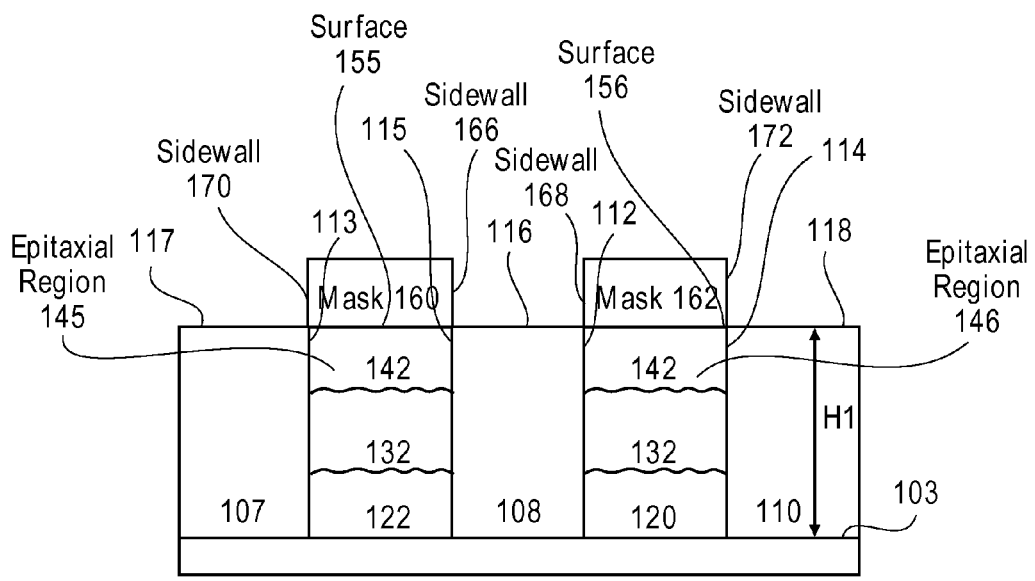
FIG. 4 shows the semiconductor substrate of FIG. 1 after polishing and patterning the epitaxial material formed above the trenches and above the STI regions to form first and second epitaxial regions.

FIG. 4 shows the semiconductor substrate of FIG. 1 after polishing and patterning epitaxial material 142 formed above the trench and above the STI regions to form first and second epitaxial regions 145 and 146. Regions 145 and 146 may be epitaxially grown regions of a first epitaxial material (e.g., to become a P- or N-type material) on the substrate surface and sidewalls of the trenches 105 and 106 formed between the STI regions. Region 145 and 146 may be described as epitaxially grown of a first epitaxial material grown from substrate surface 103 at the bottom of trenches 105 and 106 formed between inner sidewalls of STI regions 107, 108 and 110. Region 145 and 146 may be described as epitaxially regions simultaneously epitaxially grown of a first type of epitaxial material (e.g., p- or n-type) on substrate surface 103 at a bottom of trenches 105 and 106 formed beside (e.g., to the left and right of) shallow trench isolation (STI) region 108.

FIG. 4 shows material 142 polished or planarized to height H1 above surface 103. The top surface of material 142 may be polished to form a flat surface having a (100) crystal index above or at a height H1 of top surfaces 155 and 156 of material 142. Top surfaces 155 and 156 may have the same height as and be planar with top surfaces 116, 117, or 118. In some cases, after or as a result of polishing, materials 122, 132 and 142 in trenches 105 and 106 may be described as epitaxial regions 145 and 146 respectively.

Polishing or planarizing epitaxial material 142 may be performed by chemical, physical or mechanical polishing as known in the art to form a top planar surfaces 155 and 156 of material 142. Epitaxial regions 145 and 146 may have W1 and L1, and H1. In some cases, materials 122, 132 and 142 may be described as an "epitaxial region"; or a "stack" of epitaxial layers or materials (e.g., after polishing to height H5). In some embodiments, materials 122, 132 and 142 in each trench may be described as a single "epitaxial region" (e.g., as single regions 145 and 146); or a single "stack" of epitaxial layers or materials (e.g., after polishing to height H5). In some embodiments, material 122 or 132 are optional and not formed in the trench, such as where material 142 is formed on layer 132 without layer 122, or material 142 is formed on layer 122 without layer 132. In some embodiments, only material 122, 132 or 142 is formed. In some embodiments, materials 122, 132 and/or 142 in each trench, as described above, are referred to as a single region, layer or material. For some embodiments, forming materials 122, 132 and 142; or forming regions 145 and 146 is described as "simultaneously" epitaxially growing the first and second epitaxial regions. For example, "simultaneously" may describe performing, at the same time, the same processes of forming, polishing, patterning, and etching to form, polish, pattern and etch the same materials in different regions (e.g., STI and/or epitaxial regions). In this case, simultaneously epitaxially growing the first and second epitaxial regions may describe performing, at the same time, the same processes of forming materials 122 in trenches 105 and 106; then 132 in trenches 105 and 106; and then 142 in trenches 105 and 106 (e.g., in regions 145 and 146).

FIG. 4 also shows pattern or masks 160 and 162 formed on top surfaces 155 and 156 of epitaxial regions 145 and 146. In some cases, masks 160 and 162 have width W1 and height H5 above surfaces 155 and 156. Masks 160 and 162 may have a length L1. In some cases, masks 160 and 162 are formed by or of photoresist alone, or a photoresist/oxide combination; or a photoresist/nitride combination.

Masks 160 and 162 may have inner sidewalls 166 and 168 above or adjacent to sidewalls 115 and 112. In some cases, inner sidewalls 166 and 168 may be planar surfaces parallel to and aligned with (e.g., directly above) planar sidewalls 112 and 114. Masks 160 and 162 may also have inner sidewalls 170 and 172 above surfaces 113 and 114. Sidewalls 170 and 172 may be planar surfaces parallel to and above planar sidewalls 113 and 114, such as described for sidewalls 160 and 162 with respect to sidewalls 112 and 115.

According to some embodiments, W1 may be between 10 and 15 nanometers (nm); H1 may be 350 nanometers (nm); H2 may be 70 nanometers (nm); the difference in height between the top of material 122 and the top of material 132 may be 200 nanometers (nm); and the difference in height between the top of material 132 and the top of material 142 or epitaxial regions 145 and 146 may be 50 nanometers (nm). Also, L1 may be equal to W1.

The descriptions below with respect to FIGS. 5-9 and region 108 can also be applied to regions 107 and 110. In some cases, those descriptions with respect to region 108 can be simultaneously applied to regions 107 and 110, such as during processing that simultaneously effects, is applied to, or processes regions 107, 108 and 110.

In this case, simultaneously epitaxially growing the third epitaxial region may describe performing, at the same time, the same processes of forming materials 222 in trench 206 and similar trenches formed by etching regions 108 and 110; then 232 in trench 206 and similar trenches formed by etching regions 108 and 110; and then 242 in trench 206 and similar trenches formed by etching regions 108 and 110.

Figure 5:
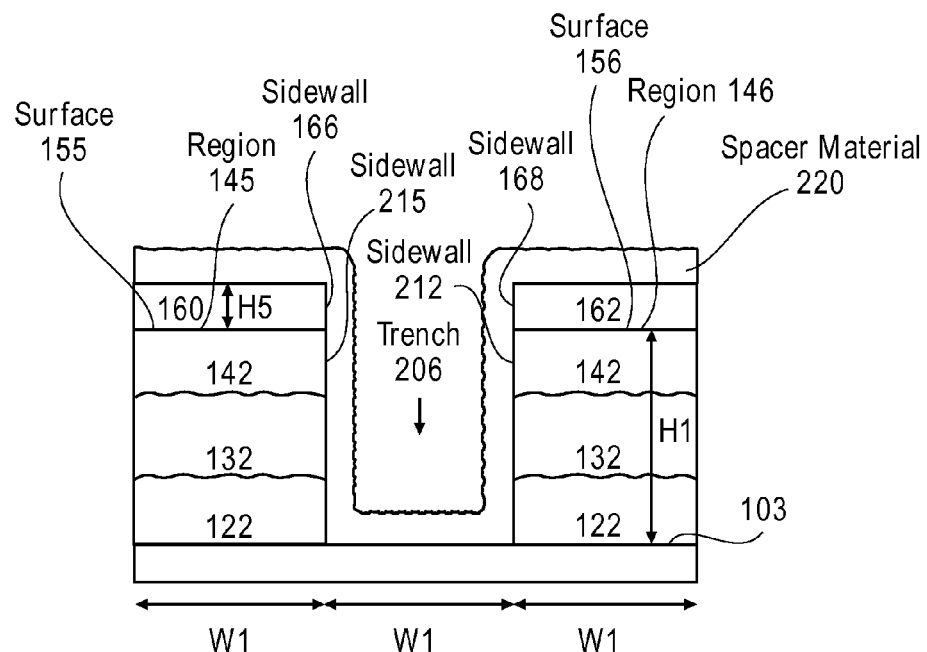
FIG. 5 shows the semiconductor substrate of FIG. 1 after etching the STI regions to form third trenches between the masked first and second epitaxial regions; and forming a conformal layer of spacer material over the masks, and the walls and bottom of the third trench.

FIG. 5 shows the semiconductor substrate of FIG. 1 after etching the STI regions to form third trenches between the masked first and second epitaxial regions; and forming a conformal layer of spacer material over the masks, and the walls and bottom of the third trench. FIG. 5 shows STI region 108 etched to expose the top surface of the substrate 103 to form trench 206 between the epitaxial regions 145 and 146. In some cases, STI region 108 is selectively etched with respect to masks 160 and 162 to form trench 206. Trench 206 may be defined by exposed the top surface 103, sidewall 215 of epitaxial region 145, and sidewall 212 of epitaxial region 146. Trench 206 may have width W1, height H1 and length L1. In some cases the width W1, height H1 and length L1 of trench 206 are equal to those of regions 145 and 146. In some cases, the height H1 and length L1 of trench 206 are equal to those of regions 145 and 146, but the width is not equal to those of regions 145 and 146.

In some cases, trench 206 may be defined by exposed the top surface 103; sidewalls 215 and 212 of the epitaxial regions, and sidewalls 166 and 168 of the masks. In this case the height of trench 206 is H1 plus H5.

Region 108 may be etched by wet or dry etching to remove material 104 that is not protected by or below masks 160 and 162. Etching region 108 may include descriptions above for etching material 104 to form STI regions 107, 108 and 110. In some cases, region 108 may be etched using a wet etch (e.g., of HF) or a dry etch to remove all material of region 108.

Trench 206 has inner sidewalls 215 and 212 below or adjacent to mask inner sidewalls 166 and 168. In some cases, inner sidewalls 215 and 212 may be planar surfaces parallel to and aligned with (e.g., directly below) planar sidewalls 166 and 168. In some cases, inner sidewalls 166 and 168 may be planar surfaces parallel to and slightly wider than planar sidewalls 115 and 112 (e.g., wider than W1 by 2-5 nm), such as due to the etching of region 108 also removing a width of sidewalls 166 and 168.

FIG. 5 a conformal layer of spacer material 220 formed on or over masks over regions 145 and 146, trench 206 sidewalls and the bottom surface of trench 206. Conformal layer of spacer material 220 formed on (e.g., touching) masks 160 and 162; sidewalls 212 and 215; and surface 103 of trench 206. This may include forming conformal layer of spacer material 220 on (e.g., touching) top surfaces, and inner sidewalls 166 and 168 (and outer sidewalls) of masks 160 and 162.

Material 220 may be formed to a conformal thickness (e.g., a "height" on the top surfaces and "width" on the sidewalls) within the width, height and length of trench 206. The conformal thickness may be between 2 and 20 nanometers (nm). In some cases the conformal thickness is approximately 5 or 10 nm.

Material 220 may be formed of an oxide or a nitride or combination thereof. Material 220 may be formed of Silicon Nitride, Silicon Oxide, or a dielectric material. Material 220 may be formed by atomic layer deposition (ALD) or chemical vapor deposition (CVD).

Figure 6:
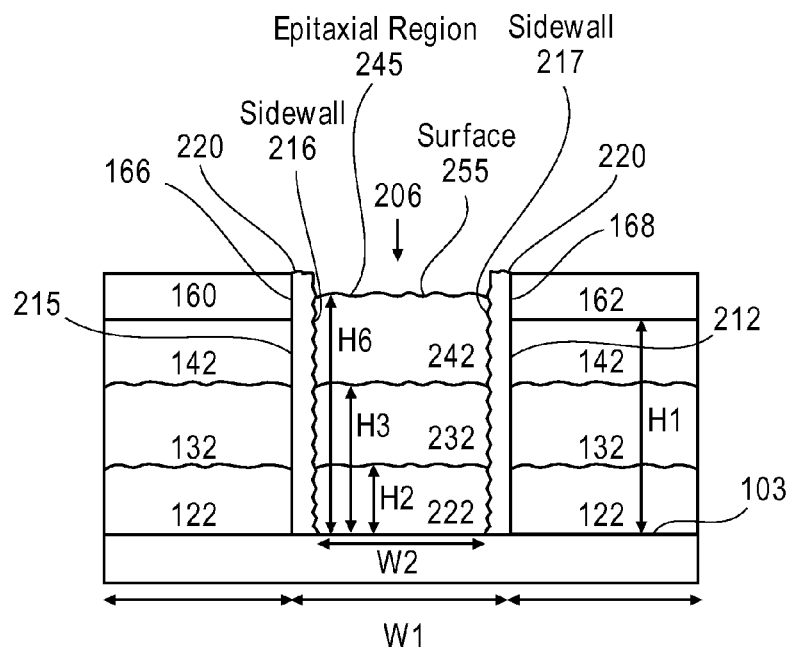
FIG. 6 shows the semiconductor substrate of FIG. 1 after etching the conformal layer of spacer material from the bottom of the third trench, and then epitaxially growing a region of a second epitaxial material in the third trench.

FIG. 6 shows the semiconductor substrate of FIG. 1 after etching the conformal layer of spacer material from the bottom of the third trench, and then epitaxially growing a region of a second epitaxial material in the third trench. FIG. 6 shows etching conformal layer of spacer material 220 to remove the conformal layer from on the substrate surface at a bottom of the third trench, and on a top surface of the masks formed over the first and second epitaxial regions, but not from the third trench sidewalls. FIG. 6 shows conformal layer of spacer material 220 etched to expose the top surface of the substrate 103 and top surfaces of masks 160 and 162. In some cases, during such etching of material 220, a portion of material 220 is not etched from, but remains on sidewalls of trench 206. In some cases, during such etching of material 220, a portion of material 220 is not etched from, but remains on sidewalls 166, 168, 212 and 215, as shown.

Material 220 may be etched by a dry etching process that removes the vertical thickness of the layer more quickly than the horizontal thickness. In some cases, the etch may be an anisotropic etch. In some cases, the etch may use Chlorine or another acidic dry chemistry. In some cases, material 220 is selectively etched with respect to material 102 and masks 160 and 162. In some cases, material 220 may be etched using a wet etch (e.g., of HF) or a dry etch to remove all horizontal portions of material 220.

After etching, etched material 220 (e.g., trench 206) has inner sidewalls 216 and 218 extending from surface 103 at least to height H1. Inner sidewall 216 may be a planar surface parallel to and having a same length (e.g., L1) and height (e.g., H1 plus H5) as sidewalls 166 and 215. Inner sidewall 218 may be planar surface parallel to and having a same length and height as sidewalls 168 and 212. After etching, inner sidewalls 216 and 218 may have a thickness (e.g., in the horizontal direction) of between 2 and 15 nanometers (nm). In some cases the conformal thickness is approximately 5 or 10 nm.

In some cases, inner sidewalls 216 and 217 form a width W2 in trench 206 that is less than W1 by the thickness of the sidewalls noted above. In other cases, inner sidewalls 216 and 217 form a width W2 in trench 206 that is equal to W1 for embodiments described herein.

FIG. 6 also shows epitaxially growing a region of a second epitaxial material (e.g., to become a P- or N-type material) on the substrate surface and sidewalls of the third trench formed between the first and second epitaxial regions. Region 245 may be epitaxially grown of a second epitaxial material grown from substrate surface 103 at the bottom of trench 206 formed between inner sidewalls 216 and 217 of epitaxial regions 145 and 146. In some cases, region 245 may be formed as or later doped to be a different P- or N-type material than regions 145 and 146 (e.g., are formed as or later doped to be). In some cases, region 245 may be an N-type material, while regions 145 and 146 are a P-type material. This may include any layers or materials within regions 245, 145 and 146, such as materials 222, 232 and 242 described below. Region 245 may have width W2, length L1, and height H6 which is greater than height H1 but less than height H1 plus H5.

FIG. 6 shows trenches 206, however it is contemplated that trench 206 may represent any number of trenches formed in between first and second epitaxial regions on substrate 101. FIG. 6 shows a first layer of material 222 epitaxially grown from surface 103 in trench 206. Material 222 may be epitaxially grown from the crystal surface of substrate surface 103. Material 222 may be formed by epitaxial growth (e.g., heteroepitaxy) using atomic layer deposition (ALD) or chemical vapor deposition (CVD), Metal-Organic Chemical Vapour Deposition (MOCVD) or Metalorganic vapour phase epitaxy (MOVPE), and may only grow from "seed" surface 103 below the trench top, but not grow from the spacer material sidewalls 216 and 217, or from mask top surfaces of masks 160 and 162. Choice of growth deposition like growth temperature, pressure of gas flux, etc may define the selectivity of the epitaxial growth. In some cases, the growth of material 222 is grown selectively from surface 103 by choosing or using a predetermined growth temperature range, pressure of gas flux range, etc., as known for material 222 to grow from material of surface 103, but not grow from or initiate on material of the spacer material sidewalls 216 and 217, or from mask top surfaces of masks 160 and 162.

Material 222 may be a first layer of crystalline material that has height H2 from surface 103 which is less than H1. Material 222 may have a bottom surface having a (100) crystal oriented material grown from surface 103, and side surfaces having a (110) crystal oriented material along or adjacent to sidewalls 216 and 217. In some embodiments, crystaline defects may exist in material 222 near or along the sidewalls 216 and 217.

Material 222 may have top surface 255 having a (100) crystal orientation (Miller Index). The top surface of material 222 may be polished or etched to form a flat surface having a (100) crystal index. Material 222 may have width W2 between sidewalls 216 and 217 in trench 206. Material 222 may have a length L1.

Material 222 may have height H2 defined by the vertical distance between top surface 103 and a top surface of material 222. In some cases, material 222 is a layer of Si70Ge30 material (e.g., 70 percent Si and 30 percent Ge).

The bottom surface of material 222 may have the same (100) crystal orientation as that of material 102 (e.g., at surface 103). In some cases, the bottom surface of material 222 may have the same crystal lattice size as that of material 102 (e.g., at surface 103). Material 222 may be a relaxed material (e.g., have a non-strained lattice) with respect to its interface with surface 103. In some cases, material 222 is a relaxed layer (partially or fully) with respect to the substrate (e.g., surface 103).

FIG. 6 shows a second layer of material 232 epitaxially grown from a top surface of material 222. Material 232 may be epitaxially grown from the crystal top surface of material 222. Material 232 may be formed by epitaxial growth (e.g., heteroepitaxy) using chemical vapor deposition (CVD), Metal-Organic Chemical Vapour Deposition (MOCVD) or Metalorganic vapour phase epitaxy (MOVPE), and may only grow from "seed" top surface of material 222 below the trench top, but not grow from the sidewalls 216 or 217, or top surfaces of masks 160 and 162. In some cases, the growth of material 232 is grown selectively from the top surface of material 222 (e.g., from material 222) by choosing or using a predetermined growth temperature range, pressure of gas flux range, etc., as known for material 232 to grow from material 222, but not grow from or initiate on material of the sidewalls 216 or 217, or top surfaces of masks 160 and 162.

Material 232 may be a second layer of crystalline material that has height H3 defined by the vertical distance between top surface 103 and a top surface of material 232. Material 232 may have a bottom surface having a (100) crystal oriented material grown from material 222, and side surfaces having a (110) crystal oriented material along or adjacent to sidewalls 216 and 217. In some embodiments, crystaline defects may exist in material 232 near or along these sidewalls. Material 232 may have a top surface having a (100) crystal orientation (Miller Index). The top surface of material 232 may be polished or etched to form a flat surface having a (100) crystal index.

Material 232 may have width W1 between sidewalls 216 and 217. Material 232 may have a length L1. According to some embodiments, the difference in height between the top of material 222 and the top of material 232 may be 200 nanometers (nm).

The bottom surface of material 232 may have the same (100) crystal orientation as that of material 222 (e.g., at its top surface). In some cases, the bottom surface of material 232 may have the same crystal lattice size as that of material 222 (e.g., at its top surface). Material 232 may be a relaxed material (e.g., have a non-strained lattice) with respect to its interface with material 222 (e.g., at its top surface). In some cases, material 232 is a relaxed layer (mostly or fully) with respect to material 222 (e.g., a top surface of material 222).

FIG. 6 shows a third layer of material 242 epitaxially grown from a top surface of material 232. Material 242 may be a "device" layer, such as a layer on or in which circuitry devices are formed, as known in the art. Such devices may include devices described herein.

Material 242 may be epitaxially grown from the crystal top surface of material 232. Material 242 may be formed by epitaxial growth (e.g., heteroepitaxy) using chemical vapor deposition (CVD), Metal-Organic Chemical Vapour Deposition (MOCVD) or Metalorganic vapour phase epitaxy (MOVPE), and may only grow from "seed" top surface of material 232 below the trench top, but not grow from sidewalls 216 or 217, or top surfaces of masks 160 and 162. In some cases, the growth of material 242 is grown selectively from the top surface of material 232 by choosing or using a predetermined growth temperature range, pressure of gas flux range, etc., as known for material 242 to grow from material 232, but not grow from or initiate on material of sidewalls 216 or 217, or top surfaces of masks 160 and 162.

Material 242 may be a third layer of crystalline material that has a height H6 defined by the vertical distance between top surface 103 and a top surface of material 242. In some cases, height H6 may be greater than H1. In some cases, material 242 has height H6 extending above or over top surfaces 155 and 156.

Material 242 may have a bottom surface having a (100) crystal oriented material grown from material 232, and side surfaces having a (110) crystal oriented material along a direction parallel to sidewalls 216 and 217. In some embodiments, crystaline defects may that existed in material 222 or 232 near or along sidewalls 216 and 217 do not extend into material 242 (e.g., do not extend into height H6 above height H3).

Material 242 may have top surface 255 having a (100) crystal orientation (Miller Index). Material 242 may have horizontal width W2. Material 242 may have a length L1. In some cases, material 242 is a single layer of Ge material. In some cases, material 242 is a multi-stack of Si70Ge30/Si30Ge70/Ge material. In some cases, when material 242 is a multi-stack, height H6 may be a height of between 50 and 300 nanometers (nm). In some cases, when material 242 is a single layer, height H6 may be a height of between 20 and 300 nanometers (nm). In some cases, H6 is approximately 50 nm. According to some embodiments, the difference in height between the top of material 232 and the top of material 242 may be 50 nanometers (nm). In some embodiments, material 222 may be or may include Si70Ge30 material (e.g., 70 percent Si and 30 percent Ge); material 232 may be or may include Si30Ge70 material; and material 142 may be or may include Ge material.

The bottom surface of material 242 may have the same (100) crystal orientation as that of material 232 (e.g., at its top surface). In some cases, the bottom surface of material 242 may have the same crystal lattice size as that of material 232 (e.g., at its top surface). Material 242 may be a relaxed material (e.g., have a non-strained lattice) with respect to its interface with material 232 (e.g., at its top surface). In some cases, material 242 has a same lattice constant as the bottom of the material 222 or that of surface 103. In some cases, material 242 is lattice matched with respect to a top surface of material 232. In some cases, material 242 is fully strained with respect to material 232 (e.g., a top surface of material 232). The strain may be tensile or compressive strain appropriate to increase carrier mobility.

After FIG. 6 (e.g., after forming region 245), electronic device fins may be formed from material 142 and 242 of eptixial regions 145, 245 and 146 (and other similar regions formed by processes of FIG. 1-6) by removing the prior etch masks; and polishing and patterning the epitaxial regions to form the device fins. Such process may include (1) recess off STI first and separately, followed by an etch of portions of the eptixial regions to form the fins, or (2) dry etch away portions of the eptixial regions only, then recess STI to form the fins, or (3) use a non-selective dry etch to remove both portions of the eptixial regions and STI simultaneously to form the fins. Then removing the resist used to mask portions of the eptixial regions to form the fins.

According to embodiments, after forming region 245, masks 160 and 162 are completely removed by etching or polishing. Such etching may include etching techniques as described for removing STI material 104. Such polishing may include polishing techniques as described for polishing epitaxial material 142.

In some cases, after forming region 245, top surface 255 of region 245 is polished. This polishing may be the same or a subsequent polishing as compared to the polishing above to remove masks 160 and 162. Such polishing may include etching spacer material 220 from height H6 to height of region 345 (e.g., to height H1). In some cases, the polishing of region 245 also polishes spacer material 220, and material 142 of regions 145 and 146. In many of these cases, the polishing of region 245 polishes material 242 of region 245, and material 142 and regions 145 and 146 (if needed) at least to height H1, or less (e.g., or lower). This polishing exposes a top surface of material 242 of region 245, and material 142 of regions 145 and 146. Such polishing may include polishing techniques as described for polishing epitaxial material 142. In some cases polishing top surface 255 of region 245 at least to height H1, or less (e.g., or lower) forms epitaxial region 345 having top surface 355 (e.g., region 245 but having height H1 instead of H6). In some cases, the polishing of region 245 also polishes spacer material 220. Such polishing may include polishing spacer material 220 from height H6 to height of region 345 (e.g., to height H1).

After polishing, a top surface of material 242 of region 245, and material 142 of regions 145 and 146 are patterned to form a pair of device fins in each region. According to some embodiments, after polishing, two portions of a top surface of (1) material 242 of region 245, (2) material 142 of region 145, and (3) material 142 of region 146 are patterned with a masks. After patterning, a thickness of epitaxial material 242 and 142 that is not under or protected by the masks, is etched down to height H7 to form two electronic device fins in each of regions 145, 146, an 245. Height H7 may be equal to or less than height H3. In some case, after patterning, the non-masked portions of top surface of material 142 of regions 145 and 146 are etched to remove a thickness of epitaxial material 12 (and optionally some height of material 132) to form two electronic device fins of material 142 in each of regions 145, 146; and the non-masked portions of top surface of material 242 of region 245 is etched to remove a thickness of eptixial material 242 (and optionally some height of material 232) to form two electronic device fins of material 242 in region 245. In some case, after patterning, the non-masked portions of top surface of material 142 (and optionally some height of material 132); and the non-masked portions of top surface of material 242 of region 245 (and optionally some height of material 232) are etched to height H7, which includes epitaxial material 122 and 132; and 222 and 232. The electronic device fins may include material 142 (and optionally some height of material 132) in each of regions 145, 146; and material 242 (and optionally some height of material 232) in region 245.

A thickness of unmasked portions of epitaxial materials 242 and 142 may be etched by a dry etching process that removes the vertical thickness of the material. In some cases, the etch may be an anisotropic etch. In some cases, the etch may be a subtractive etch, such as to etch away materials 242 and 142, with the exception of other materials, such as material 220 and the masks. In some cases, the etch may use Chlorine or another acidic dry chemistry. In some cases, materials 242 and 142 are selectively etched with respect to the masks 160 and 162. In some cases, materials 242 and 142 may be etched using a wet etch (e.g., of HF) or a dry etch to remove all unmasked horizontal portions of materials 242 and 142 above materials 232 and 132.

Figure 7:
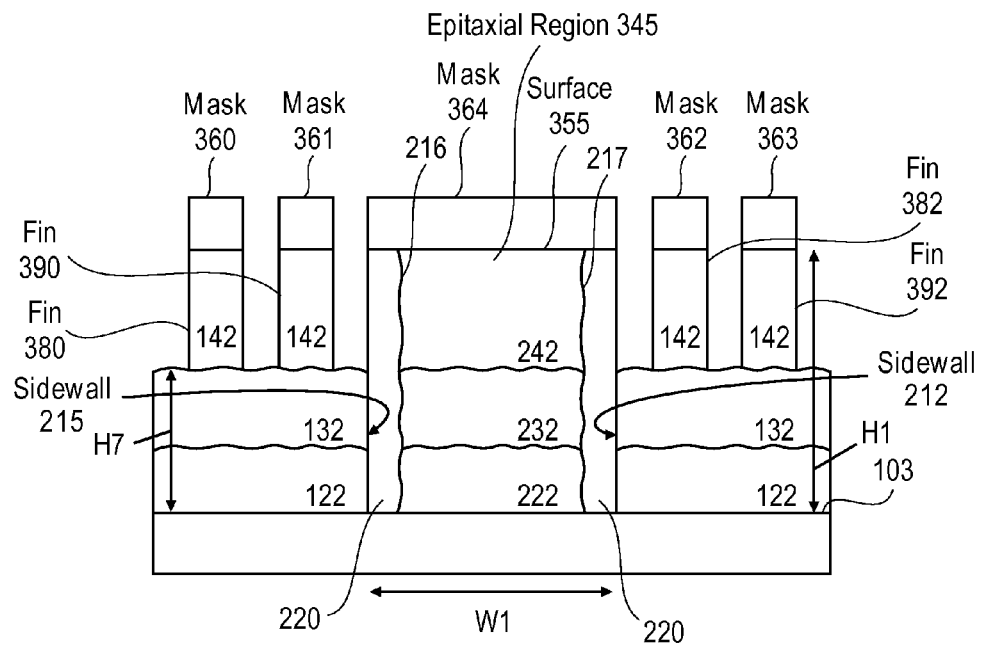
FIG. 7 shows the semiconductor substrate of FIG. 1 after removing prior etch masks, polishing and patterning first and second epitaxial regions to form device fins.
Figure 8:
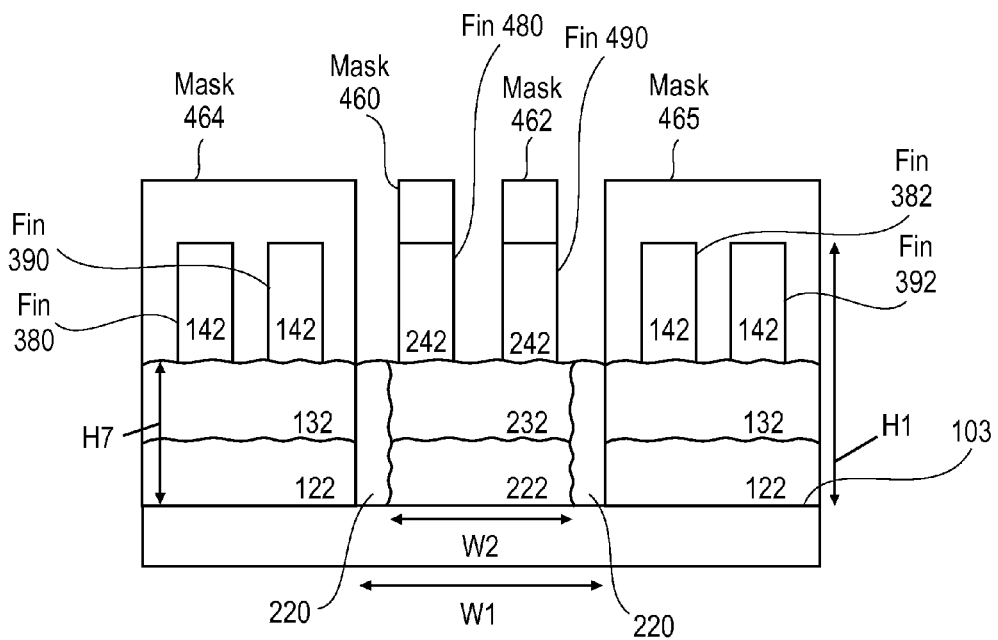
FIG. 8 shows the semiconductor substrate of FIG. 1 after removing prior etch masks from fins of first and second epitaxial regions, filling first and second epitaxial regions with STI, and polishing and patterning the third epitaxial regions to form device fins.
Figure 9:
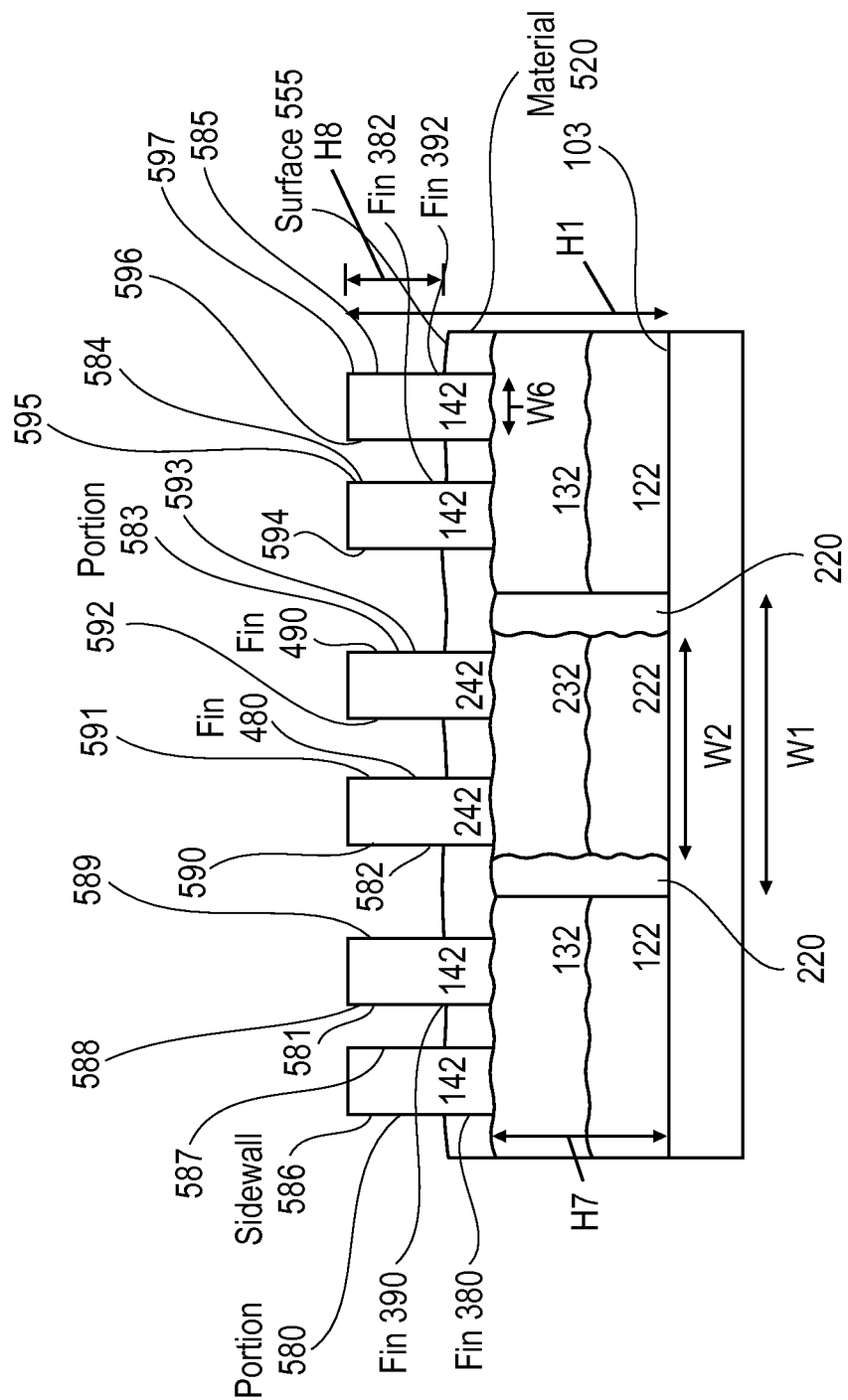
FIG. 9 shows the semiconductor substrate of FIG. 1 after forming a layer of STI material over the fins and epitaxial regions, polishing the STI layer and recess etching the polished STI layer to expose device sidewalls of electronic device fins or portions of fins.

In some case, first, patterning and etching is performed to form fins from portions of top surfaces of material epitaxial material 142 in each of regions 145 and 146; then patterning and etching is performed to form fins from portions of top surfaces of material 242 of region 245 (e.g., see FIG. 7-9). In other case, first, patterning and etching is performed to form fins from portions of top surfaces of material epitaxial material 242 in region 245; then patterning and etching is performed to form fins from portions of top surfaces of material 142 of regions 145 and 146.

FIG. 7 shows the semiconductor substrate of FIG. 1 after removing prior etch masks, polishing and patterning first and second epitaxial regions to form device fins. In some case, as shown in FIG. 7, all of top surface material 242 of region 245; and two portions of material 142 of regions 145 and 146 are patterned. Then material 142 is etched in regions 145 and 146 (e.g., where not protected by the masks) to remove material 142 (and optionally 132) to height H7 to form device fins of epitaxial material 142 in regions 145 and 146.

Such patterning may include forming masks 360 and 361 on material 142 of region 145 (e.g., a polished surface of material 142); forming masks 362 and 363 on material 142 of region 146 (e.g., a polished surface of material 142); and forming mask 364 on material 242 of region 245 (e.g., polished surface 355 of material 242). After patterning, the portions of width W1 of surfaces 155 and 156 of material 134 of regions 145 and 146, that are not masked by masks 360-363, are etched to form device fins 380, 390 and 382, 392 of regions 145 and 146, respectively, as shown in FIG. 7 (e.g., without etching portions of top surface of material 242 of region 245).

FIG. 7 shows fins 380, 390 and 382, 392 formed from epitaxial regions 145 and 146, such as by wet or dry etching to remove material 142 that is not protected by or below masks 360-363. In some embodiments, fins 380, 390 and 382, 392 may be described as "device fins" or "electronic device fins" on which electronic devices may be formed. Such etching may remove first widths of material 142 (e.g., between the masks) in trenches 105 and 106 (e.g., and adjacent to inner STI sidewalls) to height H3 to expose a top surface of material 132. Such etching may remove layer 142 to below height H3 to expose material 132 below a top surface of material 132. Such etching may also remove spacer material 220 to height H3 to expose sidewalls of material 242; or to below height H3 to expose sidewalls of material 242 and material 232 below a top surface of material 232.

FIG. 8 shows the semiconductor substrate of FIG. 1 after removing prior etch masks from fins of first and second epitaxial regions, filling first and second epitaxial regions with STI, and polishing and patterning the third epitaxial regions to form device fins. In some case, as shown in FIG. 8, all of top surface material of region 145 and 146; and two portions of material 242 of region 245 are patterned. Then material 242 is etched in region 245 (e.g., where not protected by the masks) to remove material 242 (and optionally 232) to height H7 to form device fins of epitaxial material 242 in region 245.

Such patterning may include forming masks 460 and 462 on material 242 of region 245 (e.g., a polished surface of material 242); and forming masks 464 and 465 on material 142 of regions 145 and 146 (e.g., polished surfaces of material 142). After patterning, the portions of width W1 of surface 355 of material 242 of region 245, that are not masked by masks 460 and 462, are etched to form device fins 480 and 490 over region 245, as shown in FIG. 8 (e.g., without etching portions of top surfaces of material 142 or 132 regions 145 and 146).

FIG. 8 shows fins 480 and 490 formed from epitaxial region 244, such as by wet or dry etching to remove material 242 that is not protected by or below masks 460 and 462. In some embodiments, fins 480 and 490 may be described as "device fins" or "electronic device fins" on which electronic devices may be formed. Such etching may remove first widths of material 242 (e.g., between the masks) in trench 345 to height H3 to expose a top surface of material 232. Such etching may remove layer 242 to below height H3 to expose material 232 below a top surface of material 232. In some cases, such etching may also remove spacer material 220 to height H3; or to below height H3.

In some cases, after removing prior etch masks of FIG. 6, the first, second and third epitaxial regions (regions 145, 146 and 245) may be simultaneously polished and patterned to simultaneously form two device fins in each region. In this case, masks 360-363 and 460 and 462 may be patterned at the same time or using the same patterning process, on the three regions (regions 145, 146 and 245, as shown in FIGS. 7-8) and a non-selective etch may be used at the same time or using the same process, to etch horizontal portions of material 142 and 242 that are not protected by the masks, to simultaneously form fins 380, 382, 390, 392, 480 and 490.

In this case, simultaneously forming fins 380, 382, 390, 392, 480 and 490 may describe performing, at the same time, the same processes of patterning and then etching regions 145, 146 and 245 to form fins 380, 382, 390, 392, 480 and 490. Here, and two portions of material 142 of regions 145 and 146, and of material 242 of region 245 may be patterned. Then, the same or a separate wet or dry etch may be used to remove a non-masked widths of material 142 and 242 to or below top surfaces of materials 132 and 232.

In some cases, simultaneously polishing and patterning includes forming two masks over first and second portions of top surfaces of each of the first, second and third epitaxial regions; and then simultaneously (1) etching third portions of the first and second epitaxial regions to form a first and second pair of P-type electronic device fins above the third portions of the first and second epitaxial regions, and (2) etching third portions of the third epitaxial region to form a third pair of N-type electronic device fins above the third portions of the third epitaxial region.

FIG. 9 shows the semiconductor substrate of FIG. 1 after forming a layer of STI material over the fins and epitaxial regions, polishing the STI layer and recess etching the polished STI layer to expose device sidewalls of electronic device fins or portions of fins. First, a layer of shallow trench isolation (STI) material 520 is formed or grown over fins 380, 390, 382, 392, 480 and 490; and over portions of regions 145, 146 and 245 that were etched to form the fins. In some cases, masks 360, 361, 362, 363, 460 and 480 may be removed and layer 520 formed on top surfaces of the fins and material 132 and 232 adjacent to the fins. Layer 520 may be formed to a height which is greater than the top surfaces of the fins. STI material 520 may be formed similar to, have the same crystal orientation as, have the same crystal lattice size, and may be a relaxed material similar to that of material 104. STI material 520 may be a conformal or a blanket layer formed over the surfaces.

Material 520 may then be polished or planarized to a height above or greater than height H1 of the top surfaces of the fins; and after subsequently recess etched to height H7 to expose device sidewalls of the fins, and form STI layer 522. Polishing or planarizing STI layer 520 may be performed by chemical, physical or mechanical polishing as known in the art to form a top planar surface of material 520 at a height greater than height H1. After polishing, a blanket wet etch may subsequently recess etch the top surface of the planarized material 520 down to height H7 to expose device material 142 and 242. Such etching may use dilute HF for a few seconds to remove at least a height of material 520. Such etching may leave height H7 of layer 522 of material 520 over or above top surfaces of material 132 and 232 over or above height H3.

In some cases, such etching may include exposing sidewalls of material 142 and 242 while not exposing sidewalls of material 132 or 232. In some cases, such etching may etch material 520 down to a height above or equal to height H3 to expose device material 142 and 242 of the fins, but not to expose buffer material 132 or 232.

FIG. 9 shows device portions 580, 581, 582, 583, 584 and 585 of fins 380, 390, 382, 392, 480 and 490, respectively. In some cases, the device portions may be described as "device fins" or "electronic device fins" on which electronic devices may be formed. The device portions may include device material 142 or 242. In some cases, the device portions exclude buffer material 132 or material 232. FIG. 9 shows (e.g., exposed) device sidewalls 586 and 587 of portion 580, device sidewalls 588 and 589 of portion 581, device sidewalls 590 and 591 of portion 582, device sidewalls 592 and 593 of portion 583, device sidewalls 594 and 595 of portion 584, and device sidewalls 596 and 597 of portion 585. In some cases, the device portions have width W6 and height H8 of material 142 or 242, and length L1. The device sidewalls may be planar surfaces parallel to planar sidewalls 112 and 114.

The device sidewalls may include a sufficient height, width and length of material 142 or 242 to provide a well and channel of an electronic device. The device sidewalls may include a sufficient height, width and length of material 142 or 242 to have a "fin" electronic device formed in or on them. Such electronic devices may include fin integrated circuit (IC) transistors, resistors, capacitors, etc. in or on the sidewalls. Such devices may include fin metal oxide semiconductor (MOS) transistor devices, such as those used in a complementary metal oxide semiconductor (CMOS) based on movement of electrons in N-type MOS device (n-MOS) channels and movement of positive charged holes in P-type MOS device (p-MOS) channels.

In some embodiments, material 122 may be or may include an N-type InP or GaAs material. Material 132 may be or may include an N-type InAlAs material. Material 142 may be or may include an N-type InGaAs or InAs material. These materials may provide a more defect free device fin of N-type InGaAs or InAs material to be used as a channel of an electronic device (e.g., a PMOS device).

In some embodiments, material 222 may be or may include an P-type Si70Ge30 material (e.g., 70 percent Si and 30 percent Ge). Material 232 may be or may include an P-type Si30Ge70 material. Material 142 may be or may include an P-type Ge material. These materials may provide a more defect free device fin of P-type Ge material to be used as a channel of an electronic device (e.g., an NMOS device). In other embodiments, the descriptions above of N- and P-type materials for materials 122, 132 and 142 are switched with those for materials 222, 232 and 242.

It can be appreciated that the descriptions above can be applied to first pattern and etch portions of top surface of material 242 of region 245 to form fins 480 and 490, and then the descriptions above can be applied to a secondly pattern and etch portions of top surfaces of epitaxial material 142 in each of regions 145 and 146 to form fins 380, 382, 390 and 392. It can be appreciated that the descriptions above regarding region 108 (e.g., with respect to FIGS. 5-9) can be applied to simultaneously process regions 107 and 110 as describe for region 108.

Thus, different n- and p-types of device fins may be formed by epitaxially growing first epitaxial regions of a first type material from a substrate surface at a bottom of first trenches formed between shallow trench isolation (STI) regions. The STI regions and first trench heights may be at least 1.5 times their width. The STI regions may then be etched away to expose the top surface of the substrate to form second trenches between the first epitaxial regions. Then, a layer of a spacer material may be formed in the second trenches on sidewalls of the first epitaxial regions. Second epitaxial regions of a second type material may be grown from the substrate surface at a bottom of the second trenches between the first epitaxial regions. The epitaxial regions may be patterned and etched to form pairs of electronic device fins having sidewalls upon which devices can be formed. This process may reduce crystaline defects in the fins due to lattice mismatch in the layer interfaces, and provide simultaneous forming or co-integration of n- and p-type fins from epitaxial regions formed on the same silicon surface.

Figure 10:
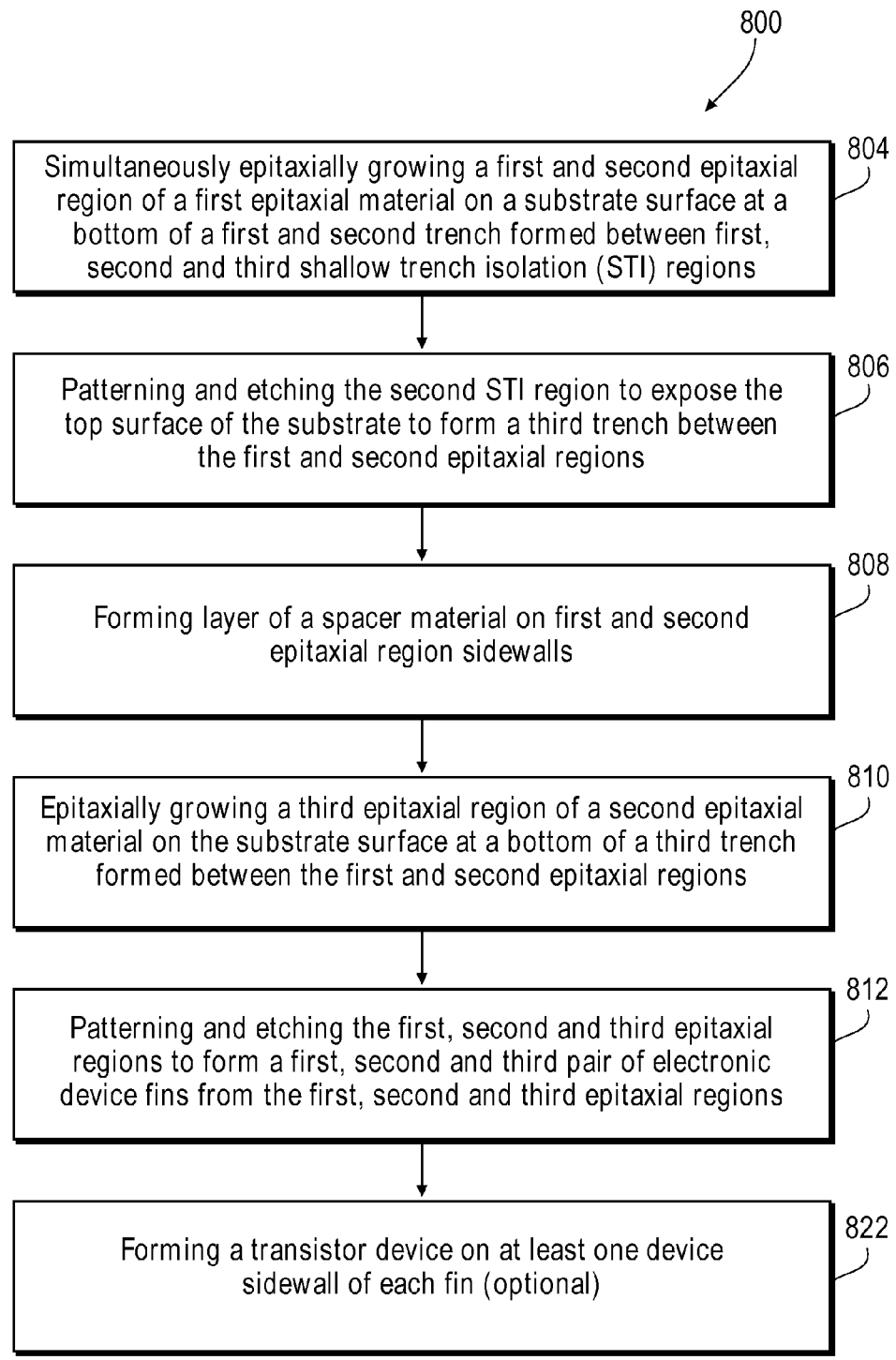
FIG. 10 is an example process for forming a pair of electronic device fins of different type material in a first, second and third epitaxial region.

FIG. 10 is an example process 1000 for forming a pair of electronic device fins of different type material in a first, second and third epitaxial region. FIG. 10 shows process 1000 beginning with block 1004 where a first and second epitaxial region of a first epitaxial material are simultaneously epitaxially grown on a substrate surface at a bottom of a first and second trench formed between first, second and third shallow trench isolation (STI) regions. The regions may include a first, second and third layer of epitaxial materials epitaxially grown on a substrate surface at a bottom of two trenches, each formed by a plurality of shallow trench isolation (STI) regions. The STI regions may be formed on a substrate to define trenches between each pair of regions. The STI regions may have STI sidewalls defining a first width W1 and a first height H1 of the trenches. The first height H1 may be at least 1.5 times the first width W1. The first width may be between 10-100 nm, and the first height may be between 30-300 nm. The substrate surface may be silicon and have a (100) crystal orientation index. This may include using more than two regions to define each trench. This may include trenches 105 and 106 defined by STI regions 107, 108 and 110. Block 804 may include descriptions above for forming trenches 105 and 106 and growing materials 122, 132 and 142 as described for FIGS. 1-4.

Then, at block 806, the second STI region is patterned and etched to expose the top surface of the substrate to form a third trench between the first and second epitaxial regions. This may include patterning and etching the second STI region 108 to expose the top surface 103 of the substrate to form a third trench 206 between the first and second epitaxial regions 145 and 146 as described above for FIGS. 4-6.

Then, at block 808, a layer of a spacer material is formed on first and second epitaxial region sidewalls. This may include forming layer of a spacer material 220 on the first and second epitaxial region sidewalls 212 and 215 as described above for FIGS. 5-6.

Then, at block 810, a third epitaxial region of a second epitaxial material is epitaxially grown on the substrate surface at a bottom of a third trench formed between the first and second epitaxial regions. This may include epitaxially growing third epitaxial region 245 of a second epitaxial materials 222, 232 and 234 on the substrate surface 103 at a bottom of third trench 206 formed between the first and second epitaxial regions 145 and 146, as described above for FIG. 6.

Then, at block 812, the first, second and third epitaxial regions are etched to form a first, second and third pair of electronic device fins from the first, second and third epitaxial regions. This may include simultaneously patterning and etching the first 145, second 146 and third 245 epitaxial regions to form a first (380,390), second (382,392) and third (480,490) pair of electronic device fins from the first, second and third epitaxial regions, as described for FIGS. 7-9.

Then, at optional block 822, a transistor device may be formed on at least one device sidewall of each fin (optional). In some cases block 822 includes forming transistor devices on each device sidewall of each fin (optional). This block is not performed for some embodiments. Block 822 may include descriptions above for forming transistor devices on device sidewall of each fin as described for FIG. 9.

Thus, embodiments have been described herein to provide a more efficient and reliable process for forming both p- and n-type epitaxial electronic device fins from the same substrate by integrating VLSI-compatible fin structures with selective epitaxial growth and fabricating devices thereon. Such integration may include forming or growing different types of P- and N-type material in different, adjacent epitaxial regions grown from the same substrate; and then forming a pair of electronic device fins of the different type material in each of the different epitaxial regions. Thus, the embodiments described herein provide benefits and advantages as compared to other processes and devices, including (1) co-integration of n- and p-mos electronic device fins from epitaxial regions grown from or on the same silicon surface 103 for CMOS implementation (e.g., and within certain length L, width W, and height H requirements as noted herein). Such co-integration of n- and p-mos may include forming of n- and p-mos epitaxial regions 145 and 245 on to the same silicon surface 103 for both n- and p-mos devices prior to etching both n- and p-mos electronic device fins from those regions.

Some embodiments described herein also provide benefits and advantages as compared to other processes and devices, including (2) a large reduction of defects propagating to the device layers on both n- and p-side electronic device fins. In some embodiments, since the defects (e.g., crystaline defects) in trenches 105, 106 and 110 have not extended into or do not exist in the fins or device portions (e.g., H7) of material 142 or material 242, the fins (e.g., device sidewalls) may provide electronic device material (e.g., wells and channels) in which defect free fin based devices may be formed (e.g., in that epitaxy overgrowth region which is the fins or device portions). For example, by forming electronic device fins (or portions) as described herein, it is possible to avoid or minimize crystaline defects that result in the fins due to or from a large lattice mismatch in materials when certain materials (e.g., type III-V, or Ge materials) are epitaxially grown on a Silicon material substrate, in trenches. Such defects include those trapped or along the sidewall of the STI forming the trenches. By avoiding or minimizing these crystaline defects can lead to yield and variation issues in a device built on a device layer or device sidewall of the fins.

In addition, some embodiments described herein also provide benefits and advantages as compared to other processes and devices, including (3) capturing defects both along (e.g., length L) and perpendicular (e.g., width W) to the electronic device fin (vertical or height) direction, thus minimizing density of defects reaching active device layers or electronic device fins. This may include providing bi-directional aspect ration trapping benefits (e.g., as noted above) in trapping defects in both along width and length of the fins).

Next, some embodiments described herein also provide benefits and advantages as compared to other processes and devices, including (4) eliminating the need to grow epitaxial layers or regions in thin (W<10 nanometers (nm)) and deep (H>200 nm) trench. This may include the ability to not need to grow epitaxial material or regions in trenches or with Width less than 10 nm, or to grown epitaxial regions in trenches or with Width greater than 10 nm. This may allows for thicker and shorter trenches and epitaxial layers, thus providing better crystal material and higher yield in the trench epitaxial material used to form fins from, while using less material and processing needed for the larger height trench.

Figure 11:
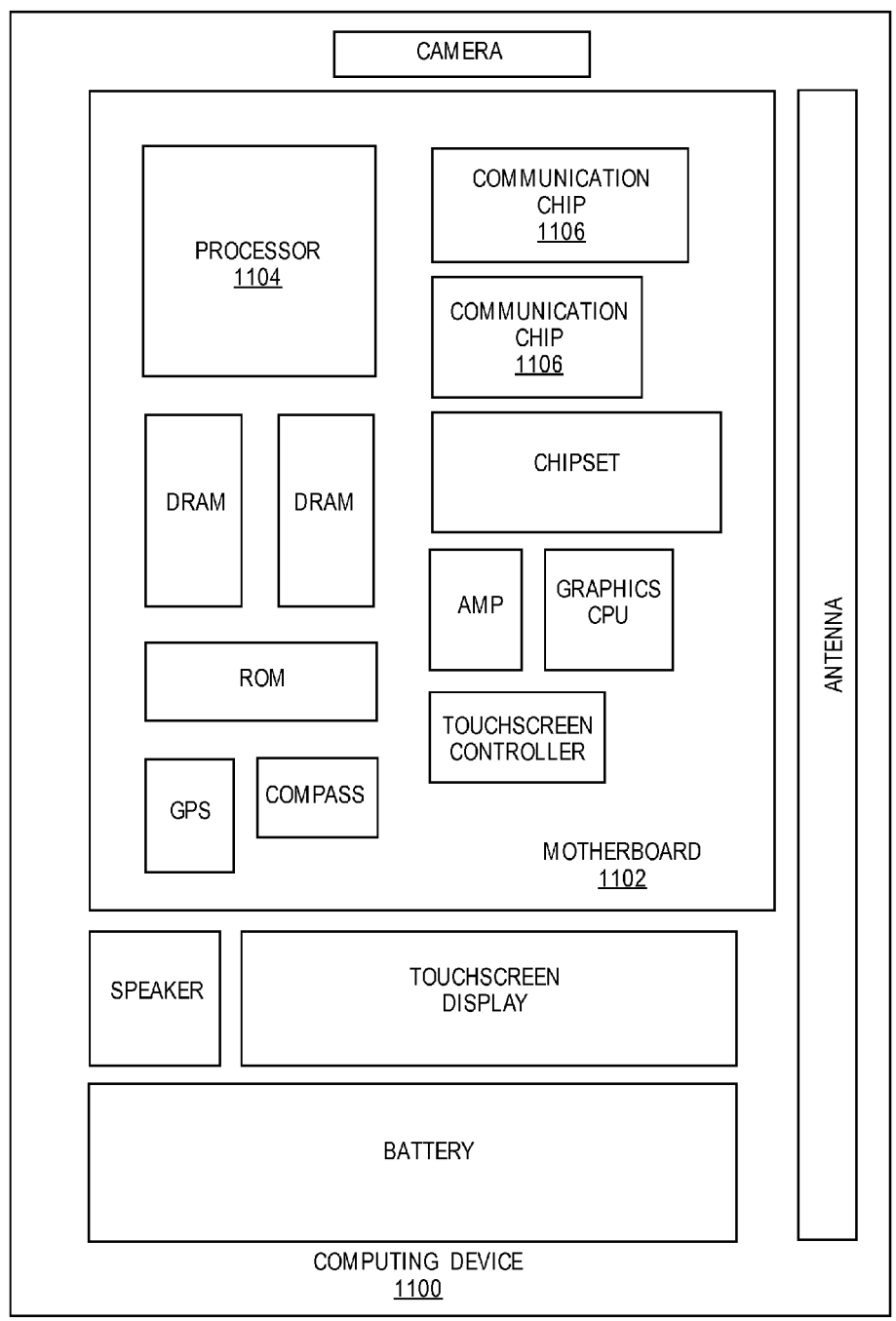
FIG. 11 illustrates a computing device in accordance with one implementation.

FIG. 11 illustrates a computing device 1100 in accordance with one implementation. The computing device 1100 houses board 1102. Board 1102 may include a number of components, including but not limited to processor 1104 and at least one communication chip 1106. Processor 1104 is physically and electrically connected to board 1102. In some implementations at least one communication chip 1106 is also physically and electrically connected to board 1102. In further implementations, communication chip 1106 is part of processor 1104.

Depending on its applications, computing device 1100 may include other components that may or may not be physically and electrically connected to board 1102. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 1106 enables wireless communications for the transfer of data to and from computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 1106 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others.

Processor 1104 of computing device 1100 includes an integrated circuit die packaged within processor 1104. In some implementations, the integrated circuit die includes a multilevel interconnect including monoliths of wiring lines and vias to that allows for air gaps in the interconnect assembly such as described with reference to FIGS. 1-6. The term "processor" may refer to any device or portion of a device that processes electronic data from registers and/or memory to transform that electronic data into other electronic data that may be stored in registers and/or memory.

Communication chip 1106 also includes an integrated circuit die packaged within communication chip 1106. In accordance with another implementation, a package including a communication chip incorporates one or more capacitors such as described above.

In further implementations, another component housed within computing device 1100 may contain a microelectronic package including an integrated circuit die such as described above.

In various implementations, computing device 1100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 1100 may be any other electronic device that processes data.

EXAMPLES

The following examples pertain to embodiments.

Example 1 is a method to form a pair of electronic device fins including simultaneously epitaxially growing a first and second epitaxial region of a first type of epitaxial material on a substrate surface at a bottom of a first and a second trench formed beside a shallow trench isolation (STI) region; patterning and etching the STI region to expose the top surface of the substrate to form a third trench between first and second epitaxial region sidewalls of the first and second epitaxial regions; forming a layer of a spacer material on the first and second epitaxial region sidewalls; epitaxially growing a third epitaxial region of a second type of epitaxial material on the substrate surface at a bottom of a third trench formed between the first and second epitaxial regions sidewalls; then patterning and etching the first, second and third epitaxial regions to form a first, second and third pair of electronic device fins from the first, second and third epitaxial regions.

In Example 2, forming a layer of a spacer material on the first and second epitaxial region sidewalls of the method of Example 1 includes forming a conformal layer of a spacer material on the first and second epitaxial region sidewalls, on the substrate surface at a bottom of a third trench, and on top surfaces of a first and second masks formed over the first and second epitaxial regions; etching the conformal layer to remove the conformal layer from on the substrate surface at a bottom of a third trench, and on a top surface of a first and second masks formed over the first and second epitaxial regions, but not from the first and second epitaxial regions sidewalls.

Example 3, is the method of Example 1, where the first trench has first STI sidewalls defining a first width and a first height for the first trench, the second trench has STI sidewalls defining the first width and the first height for the second trench, the third trench has first and second epitaxial region sidewalls defining the first width and the first height for the first trench, and the first height being at least 1.5 times greater than the first width.

Example 4, is the method of Example 1, where simultaneously epitaxially growing the first and second epitaxial regions includes epitaxially growing a first layer of epitaxial material on the substrate surface at the bottom of the first trench and the second trench to a second height above the substrate surface; epitaxially growing a second layer of buffer epitaxial material on the first layer and in the first trench and the second trench to a third height above the substrate surface; and epitaxially growing a third layer of device epitaxial material on a top surface of the second layer and in the first trench and the second trench to a fourth height above the substrate surface.

Example 5, is the method of Example 1, where simultaneously epitaxially growing the first and second epitaxial regions includes simultaneously epitaxially growing a layer of the first epitaxial material in the trenches to above a top surface of the second STI region; then polishing a top surface of the first epitaxial material down to the top surface of the second STI region to form the first and second epitaxial regions.

Example 6, is the method of Example 1, where patterning and etching the second STI region includes forming two masks over top surfaces of the first and second epitaxial regions; and etching the second STI region between the two masks.

Example 7, is the method of Example 1, where epitaxially growing the third epitaxial region includes epitaxially growing a fourth layer of epitaxial material on the substrate surface at the bottom of the third trench to the second height above the substrate surface; epitaxially growing a fifth layer of buffer epitaxial material on the fourth layer and in the third trench to the third height above the substrate surface; and epitaxially growing a sixth layer of device epitaxial material on a top surface of the fifth layer and in the third trench to the fourth height above the substrate surface.

Example 8, is the method of Example 1, where epitaxially growing the third epitaxial region includes not epitaxially growing a layer of the second epitaxial material in the third trench to above a top surface of the first epitaxial region; then not polishing a top surface of the second epitaxial material down to the top surface of the first epi region to form the third epitaxial region.

Example 9, is the method of Example 1, where patterning and etching the first, second and third epitaxial regions includes forming two masks over first and second portions of top surfaces of each of the first, second and third epitaxial regions; and simultaneously (1) etching third portions of the first and second epitaxial regions to form a first and second pair of P-type electronic device fins above the third portions of the first and second epitaxial regions, and (2) etching third portions of the third epitaxial region to form a third pair of N-type electronic device fins above the third portions of the third epitaxial region.

Example 10, is the method of Example 9, further including forming an STI layer over the third portions of the first, second and third epitaxial regions, and over the first, second and third pair of electronic device fins; polishing the STI layer to form a planar surface above a top surface of the first, second and third pair of electronic device fins; and etching the polished STI layer to expose a device portion of the first, second and third pair of electronic device fins.

Example 11, is the method of Example 10, further including forming a transistor device on at least one device sidewall of each fin of the first, second and third pair of electronic device fins.

Example 12, is the method of Example 1, where patterning and etching the first, second and third epitaxial regions includes forming two masks over first and second portions of top surfaces of each of the first and second epitaxial regions, and over the third epitaxial region; and etching third portions of the first and second epitaxial regions to form a first and second pair of electronic device fins above the third portions of the first and second epitaxial regions; then forming two masks over first and second portions of top surfaces of each of the third epitaxial region, and over the first and second epitaxial regions; and etching third portions of the third epitaxial region to form a third pair of electronic device fins above the third portions of the third epitaxial region.

Example 13, is the method of Example 1, further including forming an STI layer over the first, second and third pair of electronic device fins; polishing the STI layer to form a planar surface above a top surface of the first, second and third pair of electronic device fins; and etching the polished STI layer to expose a device portion of the first, second and third pair of electronic device fins.

Example 14, is a method to form a pair of electronic device fins including epitaxially growing first epitaxial regions of a first type of epitaxial material on a substrate surface at a bottom of first trenches formed between shallow trench isolation (STI) regions; patterning and etching the STI regions to expose the top surface of the substrate to form a second trenches between first epitaxial region sidewalls of the first epitaxial regions; forming a layer of a spacer material on the first epitaxial region sidewalls; epitaxially growing second epitaxial regions of a second type of epitaxial material on the substrate surface at a bottom of the second trenches formed between the first epitaxial regions sidewalls; then patterning and etching the first and second epitaxial regions to form first and second pairs of electronic device fins from the first and second epitaxial regions.

Example 15, is the method of Example 14, where forming a layer of a spacer material on the first epitaxial region sidewalls includes forming a conformal layer of a spacer material on the first epitaxial region sidewalls, and on the substrate surface at a bottom of the second trenches; and etching the conformal layer to remove the conformal layer from on the substrate surface at a bottom of the second trench, but not from the first epitaxial regions sidewalls.

Example 16, is the method of Example 15, where patterning and etching the first and second epitaxial regions includes forming two masks over first and second portions of top surfaces of each of the first and second epitaxial regions; and etching third portions of the first and second epitaxial regions to form a first and a second pair of electronic device fins above the third portions of the first and second epitaxial regions.

Example 17, is a method to form pairs of N-type and P-type electronic device fins including epitaxially growing first epitaxial regions of a first type material from a substrate surface at a bottom of first trenches formed between shallow trench isolation (STI) regions, the STI regions and first trench heights are at least 1.5 times their width; etching away the STI regions to expose the top surface of the substrate to form second trenches between the first epitaxial regions; forming a layer of a spacer material in the second trenches on sidewalls of the first epitaxial regions; forming second epitaxial regions of a second type material are grown from the substrate surface at a bottom of the second trenches between the first epitaxial regions; then patterning and etching the first epitaxial regions to form pairs of P-type electronic device fins having sidewalls upon which devices can be formed; and patterning and etching the second epitaxial regions to form pairs of N-type electronic device fins having sidewalls upon which devices can be formed.

Example 18, is the method of Example 17, where patterning and etching includes simultaneously patterning and etching the first and second epitaxial regions to form the pairs of electronic device fins having sidewalls upon which devices can be formed.

Example 19, is the method of Example 18, further including forming an STI layer over the first and second pair of electronic device fins; polishing the STI layer to form a planar surface above a top surface of the first and second pair of electronic device fins; and etching the polished STI layer to expose a device portion of the first and second pair of electronic device fins.

Example 20, is the method of Example 17, where patterning and etching the first and second epitaxial regions includes forming two masks over first and second portions of top surfaces of each of the first and second epitaxial regions; and etching third portions of the first and second epitaxial regions to form a first and a second pair of electronic device fins above the third portions of the first and second epitaxial regions.

Example 21, is the method of Example 17, further including forming an STI layer over the first and second pair of electronic device fins; polishing the STI layer to form a planar surface above a top surface of the first and second pair of electronic device fins; and etching the polished STI layer to expose a device portion of the first and second pair of electronic device fins.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit embodiments of the invention but to illustrate it. The scope of the embodiments of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the embodiments. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an embodiment that requires more features than are expressly recited in each claim. Rather, as the following claims reflect, inventive aspects of embodiments that may lie in less than all features of a single disclosed embodiment. For example, although the descriptions and figures above describe forming a single pair of electronic device fins in each epitaxial region, the descriptions and figures above can be applied to form one or threes fins in each region. Thus, the claims following the Detailed Description are hereby expressly incorporated into this Detailed Description, with each claim standing on its own as a separate embodiment of the invention.

The invention claimed is:

1. A method to form a pair of electronic device fins comprising:
   simultaneously epitaxially growing first and second epitaxial regions of a first type of epitaxial material on a surface of a substrate at bottoms of first and second trenches formed beside a shallow trench isolation (STI) region;
   patterning and etching the STI region to expose the surface of the substrate to form a third trench between first and second epitaxial region sidewalls of the first and second epitaxial regions;
   forming a layer of a spacer material on the first and second epitaxial region sidewalls;
   epitaxially growing a third epitaxial region of a second type of epitaxial material on the surface of the substrate at a bottom of the third trench formed between the first and second epitaxial region sidewalls; then
   patterning and etching the first, second and third epitaxial regions to form first, second and third pairs of electronic device fins from the first, second and third epitaxial regions.

2. The method of claim 1, wherein forming a layer of a spacer material on the first and second epitaxial region sidewalls comprises:
   forming a conformal layer of a spacer material on the first and second epitaxial region sidewalls, on the surface of the substrate at the bottom of the third trench, and on top surfaces of first and second masks formed over the first and second epitaxial regions;
   etching the conformal layer to remove the conformal layer from on the surface of the substrate at the bottom of the third trench, and on the top surfaces of the first and second masks formed over the first and second epitaxial regions, but not from the first and second epitaxial region sidewalls.

3. The method of claim 1, wherein the first trench has first STI sidewalls defining a first width and a first height for the first trench, the second trench has STI sidewalls defining the first width and the first height for the second trench, the third trench has first and second epitaxial region sidewalls defining the first width and the first height for the first and second trenches, and the first height being at least 1.5 times the first width.

4. The method of claim 1, wherein simultaneously epitaxially growing the first and second epitaxial regions comprises:
   epitaxially growing a first layer of epitaxial material on the surface of the substrate at the bottom of the first trench and the second trench to a second height above the surface of the substrate;
   epitaxially growing a second layer of buffer epitaxial material on the first layer and in the first trench and the second trench to a third height above the surface of the substrate; and
   epitaxially growing a third layer of device epitaxial material on a top surface of the second layer and in the first trench and the second trench to a fourth height above the surface of the substrate.

5. The method of claim 1, wherein simultaneously epitaxially growing the first and second epitaxial regions comprises:
   simultaneously epitaxially growing a layer of the first type of epitaxial material in the trenches to above a top surface of the STI region; then
   polishing a top surface of the layer of the first type of epitaxial material down to the top surface of the STI region to form the first and second epitaxial regions.

6. The method of claim 1, wherein patterning and etching the STI region comprises:
   forming two masks over top surfaces of the first and second epitaxial regions; and
   etching the STI region between the two masks.

7. The method of claim 1, wherein epitaxially growing the third epitaxial region comprises:
   epitaxially growing a fourth layer of epitaxial material on the surface of the substrate at the bottom of the third trench to the second height above the surface of the substrate;
   epitaxially growing a fifth layer of buffer epitaxial material on the fourth layer and in the third trench to the third height above the surface of the substrate; and
   epitaxially growing a sixth layer of device epitaxial material on a top surface of the fifth layer and in the third trench to the fourth height above the surface of the substrate.

8. The method of claim 1, wherein epitaxially growing the third epitaxial region comprises:
   epitaxially growing a layer of the second type of epitaxial material in the third trench to a height above a height of the top surface of the first epitaxial region; then
   polishing a top surface of the second type of epitaxial material down to the height of the top surface of the first epitaxial region to form the third epitaxial region.

9. The method of claim 1, wherein patterning and etching the first, second and third epitaxial regions comprises:
   forming two masks over first and second horizontal portions of top surfaces of each of the first, second and third epitaxial regions; and
   (1) simultaneously etching third horizontal portions of the first and second epitaxial regions to form first and second pairs of P-type electronic device fins between the third horizontal portions of the first and second epitaxial regions, and (2) etching third horizontal portions of the third epitaxial region to form a third pair of N-type electronic device fins between the third horizontal portions of the third epitaxial region.

10. The method of claim 9, further comprising:
forming an STI layer over the third horizontal portions of the first, second and third epitaxial regions, and over the first, second and third pairs of electronic device fins;
polishing the STI layer to form a planar surface above a top surface of the first, second and third pairs of electronic device fins; and
etching the polished STI layer to expose a device portion of the first, second and third pairs of electronic device fins.

11. The method of claim 10, further comprising:
forming a transistor device on at least one device sidewall of each fin of the first, second and third pairs of electronic device fins.

12. The method of claim 1, wherein patterning and etching the first, second and third epitaxial regions comprises:
forming two masks over first and second horizontal portions of top surfaces of each of the first and second epitaxial regions, and over the third epitaxial region; and
etching third horizontal portions of the first and second epitaxial regions to form first and second pairs of electronic device fins between the third horizontal portions of the first and second epitaxial regions; then
forming two masks over first and second horizontal portions of top surfaces of the third epitaxial region, and over the first and second epitaxial regions; and
etching third horizontal portions of the third epitaxial region to form a third pair of electronic device fins between the third horizontal portions of the third epitaxial region.

13. The method of claim 1, further comprising:
forming an STI layer over the first, second and third pairs of electronic device fins;
polishing the STI layer to form a planar surface above a top surface of the first, second and third pairs of electronic device fins; and
etching the polished STI layer to expose a device portion of the first, second and third pairs of electronic device fins.

14. A method to form a pair of electronic device fins comprising:
epitaxially growing first epitaxial regions of a first type of epitaxial material on a surface of a substrate at bottoms of first trenches formed between shallow trench isolation (STI) regions;
patterning and etching the STI regions to expose the surface of the substrate to form second trenches between first epitaxial region sidewalls of the first epitaxial regions;
forming a layer of a spacer material on the first epitaxial region sidewalls;
epitaxially growing second epitaxial regions of a second type of epitaxial material on the surface of the substrate at bottoms of the second trenches formed between the first epitaxial region sidewalls; then
patterning and etching the first and second epitaxial regions to form first and second pairs of electronic device fins from the first and second epitaxial regions.

15. The method of claim 14, wherein forming a layer of a spacer material on the first epitaxial region sidewalls comprises:
forming a conformal layer of a spacer material on the first epitaxial region sidewalls, and on the surface of the substrate at bottoms of the second trenches;
etching the conformal layer to remove the conformal layer from on the surface of the substrate at the bottoms of the second trenches, but not from the first epitaxial region sidewalls.

16. The method of claim 15 wherein patterning and etching the first and second epitaxial regions comprises:
forming two masks over first and second horizontal portions of top surfaces of each of the first and second epitaxial regions; and
etching third horizontal portions of the first and second epitaxial regions to form first and second pairs of electronic device fins between the third horizontal portions of the first and second epitaxial regions.

17. A method to form pairs of N-type and P-type electronic device fins comprising:
epitaxially growing first epitaxial regions of a first type material from a surface of a substrate at bottoms of first trenches formed between shallow trench isolation (STI) regions, the STI regions and first trenches having heights at least 1.5 times their widths;
etching away the STI regions to expose the surface of the substrate to form second trenches between the first epitaxial regions;
forming a layer of a spacer material in the second trenches on sidewalls of the first epitaxial regions;
forming second epitaxial regions of a second type material are grown from the surface of the substrate at bottoms of the second trenches between the first epitaxial regions; then
patterning and etching the first epitaxial regions to form first pairs of P-type electronic device fins having sidewalls upon which devices can be formed; and
patterning and etching the second epitaxial regions to form second pairs of N-type electronic device fins having sidewalls upon which devices can be formed.

18. The method of claim 17, wherein patterning and etching the first and second epitaxial regions comprises:
simultaneously patterning and etching the first and second epitaxial regions to form the pairs of electronic device fins having sidewalls upon which devices can be formed.

19. The method of claim 18, further comprising:
forming an STI layer over the first and second pairs of electronic device fins;
polishing the STI layer to form a planar surface above a top surface of the first and second pairs of electronic device fins; and
etching the polished STI layer to expose a device portion of the first and second pairs of electronic device fins.

20. The method of claim 17, wherein patterning and etching the first and second epitaxial regions comprises:
forming two masks over first and second horizontal portions of top surfaces of each of the first and second epitaxial regions; and
etching third horizontal portions of the first and second epitaxial regions to form first and second pairs of electronic device fins between the third horizontal portions of the first and second epitaxial regions.

21. The method of claim 17, further comprising:
forming an STI layer over the first and second pairs of electronic device fins;
polishing the STI layer to form a planar surface above a top surface of the first and second pairs of electronic device fins; and
etching the polished STI layer to expose a device portion of the first and second pairs of electronic device fins.

* * * * *